United States Patent
Straeussnigg et al.

(10) Patent No.: US 9,976,924 B2
(45) Date of Patent: May 22, 2018

(54) SYSTEM AND METHOD FOR A MEMS SENSOR

(71) Applicant: Infineon Technologies AG, Neubiberg (DE)

(72) Inventors: Dietmar Straeussnigg, Villach (AT);
Christian Ebner, Munich (DE);
Ernesto Romani, Munich (DE);
Stephan Mechnig, Munich (DE);
Andreas Wiesbauer, Poertschach (AT);
Christian Jenkner, Klagenfurt (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days. days.

(21) Appl. No.: 15/078,733

(22) Filed: Mar. 23, 2016

(65) Prior Publication Data
US 2017/0023429 A1    Jan. 26, 2017

Related U.S. Application Data

(60) Provisional application No. 62/150,027, filed on Apr. 20, 2015.

(51) Int. Cl.
*H03M 1/10* (2006.01)
*G01L 19/00* (2006.01)
(Continued)

(52) U.S. Cl.
CPC ............ *G01L 19/00* (2013.01); *G01L 9/0072* (2013.01); *H03L 7/0891* (2013.01); *H03M 3/336* (2013.01);
(Continued)

(58) Field of Classification Search
CPC ........ H03M 3/332; H03M 3/43; H03M 3/454; H03M 3/334; H03M 1/12; H03M 1/0641;
(Continued)

(56) References Cited

U.S. PATENT DOCUMENTS 6,462,685 B1 * 10/2002 Korkala ............... H03M 3/334
                                                          341/131
7,961,126 B2 *  6/2011 Deval ..................... H03M 3/33
                                                          341/131
(Continued)

FOREIGN PATENT DOCUMENTS

GB        2451536 A   * 2/2009 ........... H03F 1/0227
KR    20130112792 A    10/2013
WO     2013119945 A1    8/2013

OTHER PUBLICATIONS

"Clock dithering technique tackles chip interference—Electronics Weekly", 1999 https://www.electronicsweekly.com > News > Archived > Resources.*

(Continued)

*Primary Examiner* — Linh Nguyen
(74) *Attorney, Agent, or Firm* — Slater Matsil, LLP

(57) ABSTRACT

According to an embodiment, a sensor circuit includes a sigma-delta analog to digital converter (ADC), a dithered clock coupled to the sigma-delta ADC, and a supply voltage circuit coupled to the sigma-delta ADC. The sigma-delta ADC is configured to be coupled to a low frequency transducer, and the dithered clock is configured to control of the sigma-delta ADC based on a dithered clock signal.

26 Claims, 22 Drawing Sheets

(51) Int. Cl.
   *H03M 3/00* (2006.01)
   *G01L 9/00* (2006.01)
   *H03L 7/089* (2006.01)
   *G01D 5/24* (2006.01)

(52) U.S. Cl.
   CPC ........... *H03M 3/462* (2013.01); *H03M 3/496* (2013.01); *G01D 5/24* (2013.01)

(58) Field of Classification Search
   CPC ...... H03M 3/448; H03M 3/328; H03M 3/456; H03M 7/3008; H03M 1/0639; H03M 1/201; H03M 3/424; H03M 3/34
   USPC .................................................. 341/131, 143
   See application file for complete search history.

(56) References Cited

U.S. PATENT DOCUMENTS

| | | | | |
|---|---|---|---|---|
| 2007/0186668 A1* | 8/2007 | Garverick | ............ | G01L 19/086 73/780 |
| 2008/0238391 A1* | 10/2008 | Williams | ............ | H01F 7/1844 323/283 |
| 2012/0043974 A1* | 2/2012 | van den Boom | ... | H03M 1/1295 324/658 |
| 2013/0214952 A1* | 8/2013 | Makinwa | ............... | H03M 1/145 341/143 |
| 2013/0265183 A1* | 10/2013 | Kleks | .................... | H03M 3/494 341/143 |
| 2013/0278447 A1* | 10/2013 | Kremin | ................... | G06F 3/044 341/20 |
| 2014/0318958 A1* | 10/2014 | Hassibi | ............... | G01N 27/3277 204/403.01 |
| 2014/0320324 A1* | 10/2014 | Canard | ................. | G04F 10/005 341/131 |
| 2015/0270847 A1* | 9/2015 | Opris | .................... | H03M 3/332 341/143 |

OTHER PUBLICATIONS

Gonzales et al., "Idle tone behavior in Sigma Delta Modulation", Audio Engineering Society, 122 Convention, May 5-8, 2007, Vienna, Austria, 13 pp.

* cited by examiner

SYSTEM AND METHOD FOR A MEMS SENSOR

This application claims the benefit of U.S. Provisional Application No. 62/150,027, filed on Apr. 20, 2015, which application is hereby incorporated herein by reference in its entirety.

CROSS-REFERENCE TO RELATED APPLICATIONS

This patent application further relates to the following co-pending and commonly assigned U.S. patent applications that also claim the benefit of U.S. Provisional Application No. 62/150,027, filed on Apr. 20, 2015: Ser. No. 15/074,510, filed on Mar. 18, 2016, and entitled "System and Method for a Capacitive Sensor", Ser. No. 15/074,649, filed on Mar. 18, 2016, and entitled "System and Method for a MEMS Sensor", and Ser. No. 15/085,467, filed on Mar. 23, 2016, and entitled "System and Method for a MEMS Sensor", which applications are hereby incorporated herein by reference in their entirety.

TECHNICAL FIELD

The present invention relates generally to electronic circuits, and, in particular embodiments, to a system and method for a microelectromechanical systems (MEMS) interface circuit.

BACKGROUND

Microelectromechanical Systems (MEMS), which in general include miniaturizations of various electrical and mechanical components, are produced by a variety of materials and manufacturing methods, and are useful in a wide variety of applications. These applications include automotive electronics, medical equipment, and smart portable electronics such as cell phones, Personal Digital Assistants (PDAs), hard disk drives, computer peripherals, and wireless devices. In these applications, MEMS may be used as sensors, actuators, accelerometers, switches, micro-mirrors and many other devices. MEMS are also desired for use in environmental pressure measurement systems to measure either absolute or differential environmental pressures.

When designing a system that uses a MEMS device as a sensor, various attributes that may be taken into account include, for example, resolution and temperature sensitivity. Any ringing noise and energy losses caused by mechanical resonances of the MEMS device may also be considered. In some systems, such mechanical resonances may generate oscillations in response to an excitation signal, and these oscillations may have energy losses characterized by a Quality factor (Q). A higher Q indicates a lower rate of energy loss relative to the stored energy of the resonator, and thus mechanical oscillations die out more slowly. A lower Q indicates a higher rate of energy loss relative to the stored energy of the resonator, and therefore mechanical oscillations die out more quickly.

SUMMARY OF THE INVENTION

According to an embodiment, a sensor circuit includes a sigma-delta analog to digital converter (ADC), a dithered clock coupled to the sigma-delta ADC, and a supply voltage circuit coupled to the sigma-delta ADC. The sigma-delta ADC is configured to be coupled to a low frequency transducer, and the dithered clock is configured to control of the sigma-delta ADC based on a dithered clock signal.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
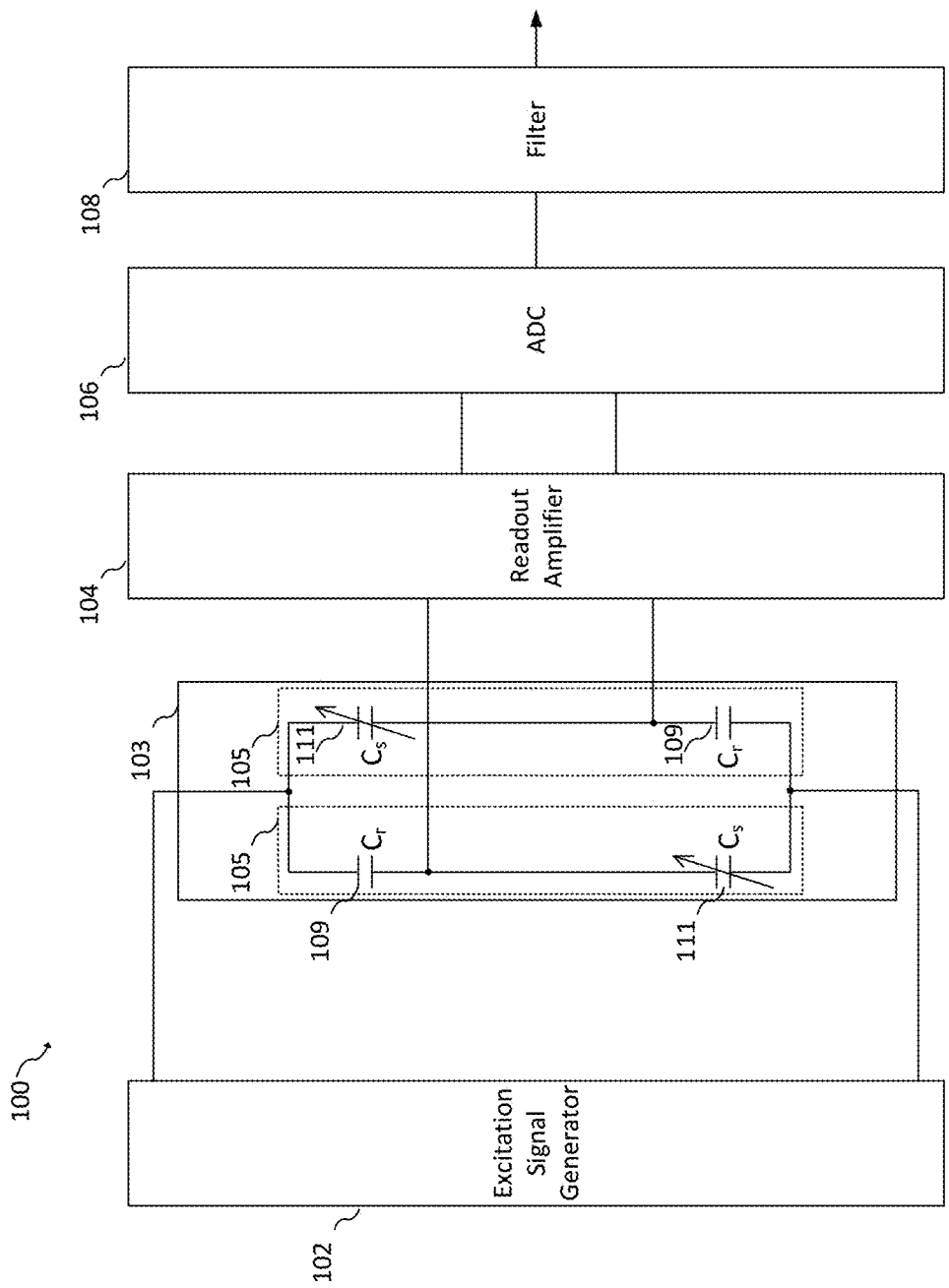
FIG. 1 is a block diagram illustrating a pressure measurement device that includes a MEMS-based sensor in accordance with embodiments of the present invention.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for performing a measurement a capacitive pressure-measurement system that uses a MEMS-based sensor. Further embodiments may be applied to other sensor systems such as, for example, piezo-resistive sensor systems. Some of the various embodiments described herein include capacitive MEMS pressure sensors, interface circuits, sigma-delta analog to digital converters (ADCs) for MEMS pressure sensor interface circuits, noise in interface circuits, and dithered clocks for sigma-delta ADCs and interface circuits. In other embodiments, aspects may also be applied to other applications involving any type of transducer system according to any fashion as known in the art.

A capacitive MEMS pressure transducer uses a pressure difference between two regions to adjust a variable capacitance structure and generate an output signal proportional to the pressure difference. In one specific application, a differential output capacitive MEMS pressure transducer uses two variable capacitance structures to generate a differential output that varies according to the measured pressures. In various embodiments, the signal output from the pressure transducer is an analog signal. The analog signal may be amplified and converted to a digital signal.

In embodiments of the present invention, a capacitive MEMS pressure sensor is operated by introducing a periodic excitation signal at a first port of the MEMS pressure sensor, and monitoring an output of the MEMS pressure sensor at a second port of the MEMS pressure sensor. A pressure measurement is then made by determining amplitude of the signal at the second port of the MEMS sensor. One issue faced in such systems is an underdamped response of the MEMS-based sensor due to mechanical resonances within the MEMS-based sensor, which can lead to measurement error in some circumstances due to the ringing nature of the output signal. In various embodiments, disclosed herein, systems and methods of measuring such an underdamped system are disclosed.

In a first embodiment, in order to reduce error caused by the underdamped response of the MEMS pressure sensor to the excitation signal, the slope of the excitation signal is reduced in order to attenuate harmonics that may stimulate the underdamped response of the MEMS pressure sensor. In some embodiments, the excitation signal is conditioned or generated such that instances of sharp edges are reduced or eliminated. In a specific embodiment, slope reduction is achieved by generating a dual slope integrated triangular waveform from a square wave input signal and integrating this signal again to generate a periodic waveform having a smooth transition between a first signal level and a second signal level. In some embodiments, the slope of the first square wave signal is controlled by delay-locked loop in order to synchronize an edge of the slope reduced excitation pulse with an incoming clock signal.

In a second embodiment, the output of the MEMS-based sensor is measured using a dithered sampling clock. By dithering the sampling time with respect to the underdamped response of the MEMS, a series of measurements may be taken in which the underdamped component of the MEMS response averages out. More specifically, a period of a variable clock signal is changed at regular intervals that correspond to a switching frequency. At a switching time after each such regular interval, the period of the variable clock signal is increased relative to a minimum period by a period adjustment amount that is pseudo-randomly determined. Equivalently, the frequency of the variable clock signal is decreased by a frequency shift that corresponds to the period adjustment amount. The switching frequency of the variable clock signal is designed to be close to the mechanical resonant frequency of a MEMS-based sensor. A sampling clock signal is derived by dividing the frequency of the variable clock signal. To spread the resonant ringing noise of the MEMS-based sensor output, this output is digitally sampled at pseudo-randomly varying intervals in accordance with the sampling clock signal. Multiple digital samples are then filtered and combined to suppress the wideband ringing noise.

In a third embodiment, the MEMS pressure sensor is implemented using an array or MEMS pressure sensors that have varying dimensions, such that each of the MEMS pressure sensors resonate at different frequencies. Hence, when the MEMS pressure sensors are stimulated by the excitation signal, the amplitude of the ringing may be reduced at various times due to the various resonant responses being out of phase with each other. By sampling the output of the MEMS sensor when the destructive interference of the various MEMS pressures reduces the amplitude of ringing response, a more accurate measurement may be made.

In a fourth embodiment, an oversampled analog to digital converter (ADC) is used to monitor the output of the MEMS sensor. In order to alleviate idle tones in the oversampled ADC, a dithered clock is used to operate the oversampled ADC. In some embodiments, the dither clock signal may be generated according to the second embodiment disclosed herein.

FIG. 1 shows an embodiment pressure measurement device 100 that includes a sensor 103. The sensor 103 is coupled to outputs of an excitation signal generator 102. The excitation signal generator 102 generates an alternating excitation signal that it provides to the sensor 103, which generates an analog measurement signal made up of two excitation response signals. Each of these excitation response signals is generated by oscillations of a resonance of sensor 103 that may be, e.g., a mechanical resonance. In an embodiment, the sensor 103 has an underdamped response.

Referring again to FIG. 1, the sensor 103 includes a capacitance bridge having two bridge sections 105. Each bridge section 105 respectively includes a pressure-sensitive capacitor 111 in series with a reference capacitor 109, and one of the response signals of the sensor 103 is output at a center tap between the pressure-sensitive capacitor 111 and the reference capacitor 109. The reference capacitors 109 have a capacitance of $C_r$ that is relatively stable over pressure as compared to the capacitance $C_s$ of the pressure-sensitive capacitors 111. In an embodiment, the pressure-sensitive capacitors 111 are respectively implemented using one or more high-Q MEMS elements included in the sensor 103, and these MEMS elements have a mechanical resonance with a resonant frequency $f_r$. In some embodiments, the reference capacitors 109 are implemented using capacitors selected such that $C_r$ changes with temperature in a known relationship relative to the temperature-induced change of $C_s$.

A readout amplifier 104 coupled to outputs of the sensor 103 amplifies these sensor response signals. An analog-to-digital converter (ADC) 106 coupled to outputs of the readout amplifier 104 then samples the difference between the amplified sensor response signals to provide digital samples. A filter 108 coupled to the ADC 106 combines several of these digital samples over a time interval to generate a single pressure measurement sample. In some embodiments, the filter 108 is a low-pass filter that averages the digital samples. In other embodiments, the filter 108 combines the digital samples using a more complex algorithm, which may include, for example, selecting the sample having the median value, discarding outlier samples before averaging, etc.

In some embodiments, each of the excitation signal generator 102, the sensor 103, the readout amplifier 104, the ADC 106, and the filter 108 of the pressure measurement device 100 are included in a single Integrated Circuit (IC), and this IC has a volume that is less than 10 cubic millimeters. In other embodiments, multiple ICs may be included in the pressure measurement device 100.

Figure 2C:
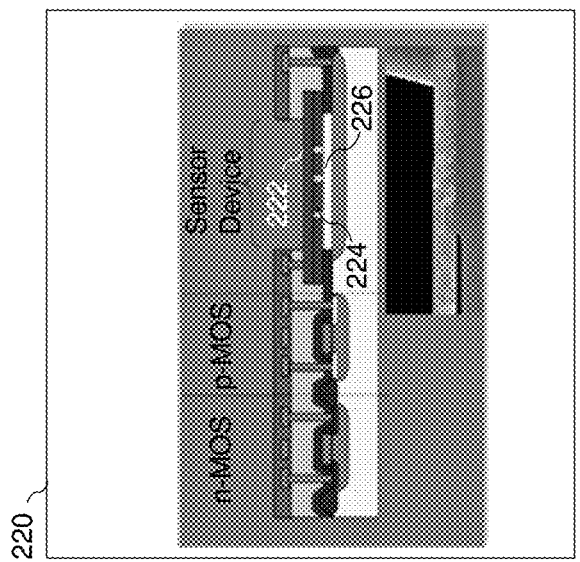
FIGS. 2a thru 2c illustrate a MEMS capacitor array layout in bridge configuration and cross section of an MEMS capacitor.
Figure 2B:
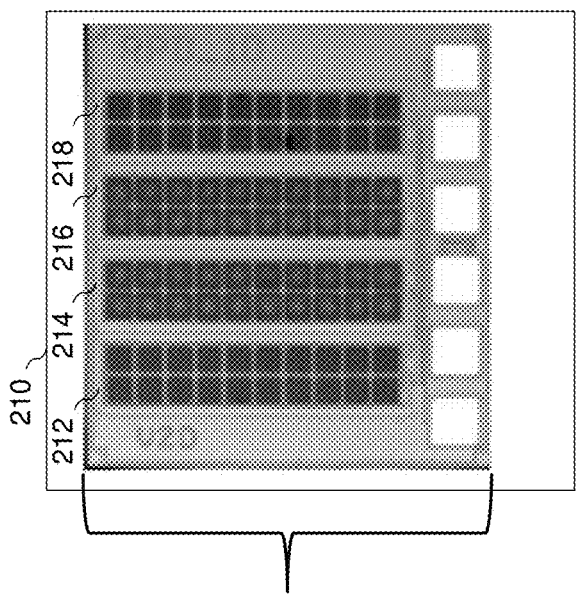
Figure 2A:
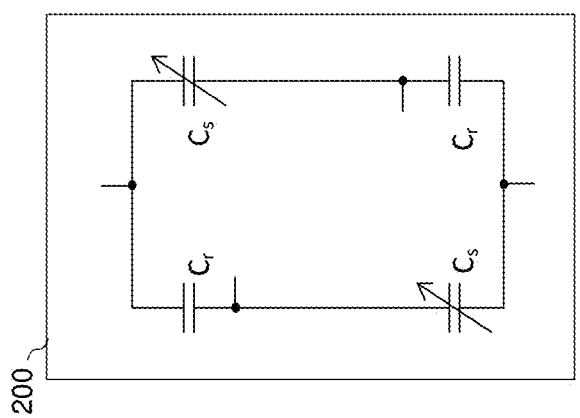

FIGS. 2a-c illustrate an example implementation of a MEMS sensor that may be used to implement sensor 103 shown in FIG. 1. As shown, in FIG. 2a, the MEMS sensor is arranged in a bridge configuration that includes fixed capacitors $C_r$ and variable capacitors $C_s$. In an embodiment variable capacitors $C_s$ are each implemented using an array of MEMS sensors, while the fixed capacitors are implemented using an array of fixed capacitors that are designed to track a nominal capacitance of the array of MEMS sensors.

FIG. 2b shows an example embodiment layout 210 of the MEMS capacitor sensor array 200. As shown, the layout includes fixed capacitance cells 212 and 218 that are used to implement capacitances $C_r$, and MEMS sensor cells 214 and 216 that are sensitive to pressure. As shown, layout 210 configuration may be arranged to avoid gradient mismatch between all four capacitors in the bridge. In an embodiment, MEMS sensor cells 214 may be implemented using MEMS sensor structures known in the art, while fixed capacitance cells may be implemented using MEMS sensor cells whose motion is disabled. By using a similar physical structure for both MEMS sensor cells 214 and 216 and fixed capacitance cells 212 and 218, good matching between MEMS sensor cells 214 and 216 and fixed capacitance cells 212 and 218 may be achieved over process and temperature variations. In some embodiments, the motion of fixed capacitance cells 212 and 218 may be prevented, for example, by not opening a pressure port during processing of the semiconductor component, or by adding mechanical motion barriers within the MEMS structure.

FIG. 2c illustrates a cross-section of a MEMS sensor cell 220 alongside an example NMOS and PMOS transistor. As shown, the MEMS sensor cell is formed with a poly-silicon membrane acting as a top electrode 222 and a fixed counter electrode 224 to form the sensor cell. There is a vacuum cavity 226 between the top electrode and the fixed counter electrode. The top electrode 222 is not covered to allow any pressure application and causing a change in capacitor value. It should be appreciated that cross-section 220 is just one of many examples of suitable MEMS cells that may be used in embodiments of the present invention.

Figure 3:
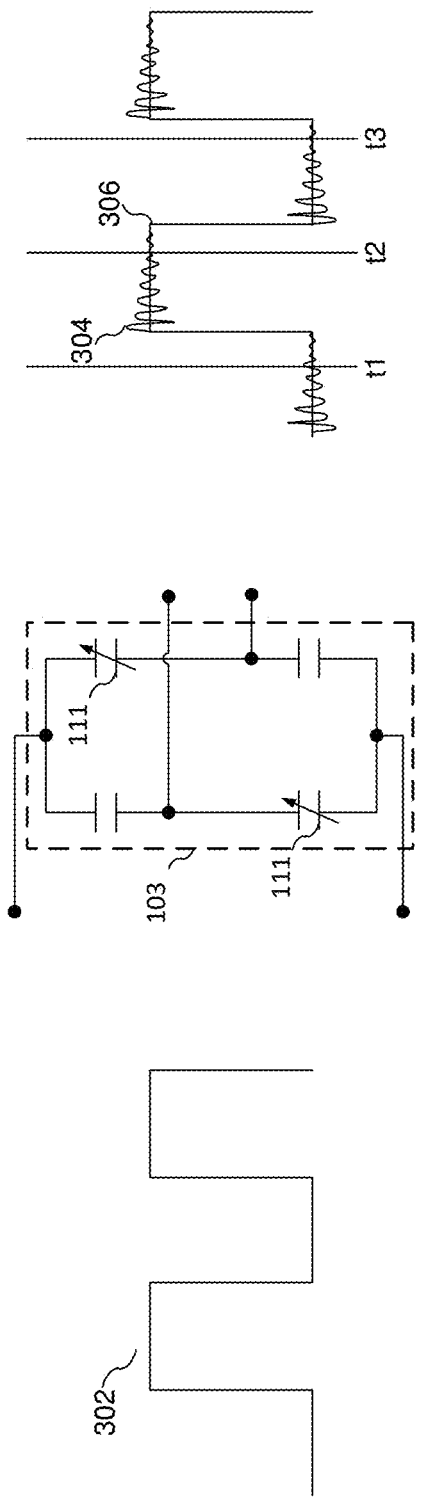
FIG. 3 is a graph illustrating waveforms for a differential response signal having ringing noise and for a square-wave excitation signal in accordance with embodiments of the present invention.

FIG. 3 shows waveforms for an embodiment square-wave excitation signal 302 and a differential response signal 304. The square-wave excitation signal is one embodiment of an alternating excitation signal that may be produced by the excitation signal generator 102 of FIG. 1. In other embodiments, any alternating excitation signal may be used, including for example, a sinusoidal signal, a triangular signal, a composite signal, etc.

Referring again to FIG. 3, the differential response signal 304 represents the difference between the response signals at the outputs of the sensor 103 of FIG. 1. Because the one or more MEMS elements that make up the pressure-sensitive capacitors 111 are high Q, the mechanical resonance of these MEMS elements is under-damped and mechanical oscillations die out slowly. At various sampling times t1, t2, and t3, a ringing noise is therefore introduced into the differential response signal 304 relative to the ideal response signal 306 of a sensor formed from ideal capacitors.

First Embodiment

Figure 4:
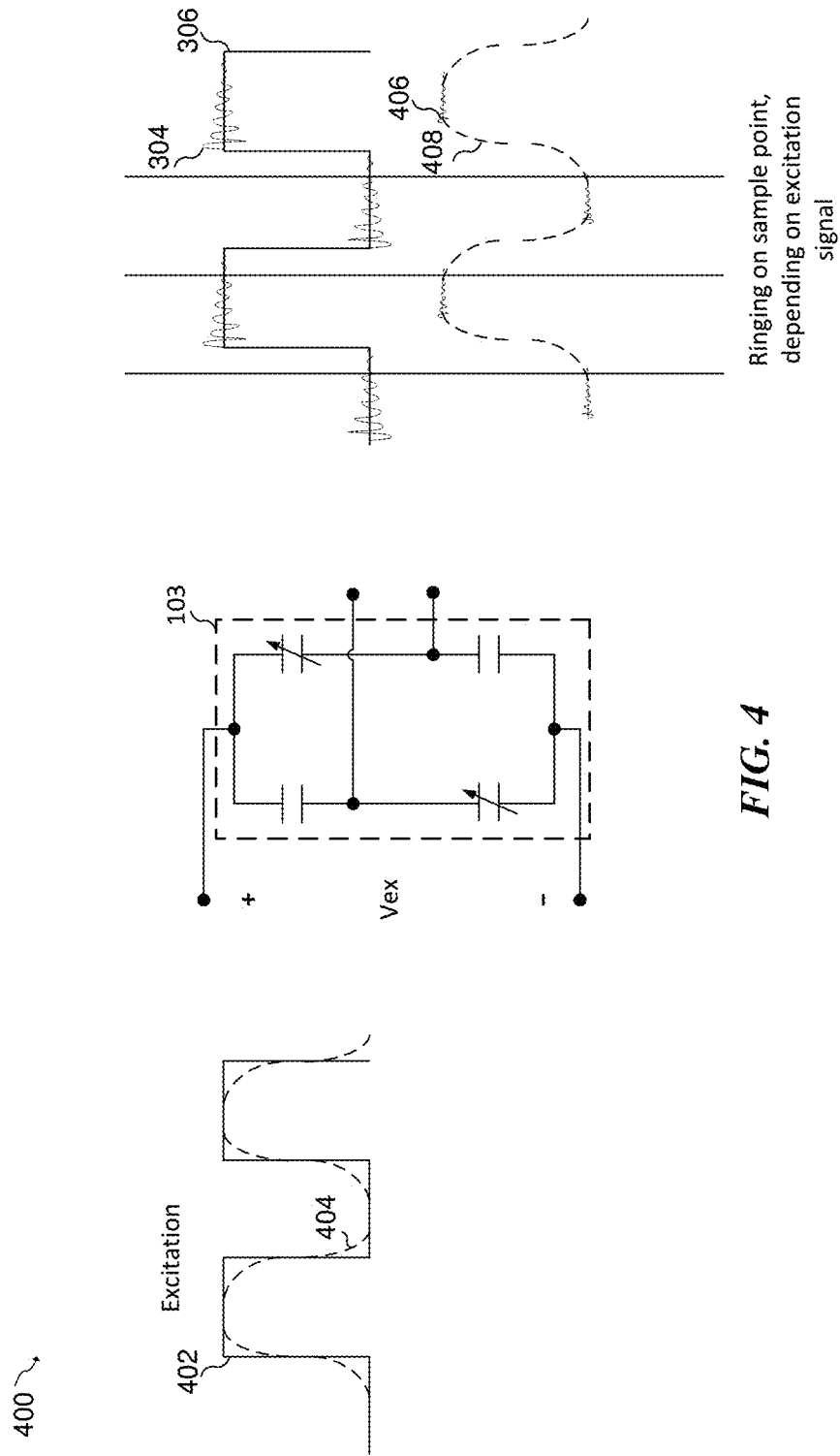
FIG. 4 illustrates a current embodiment input and output waveforms for a MEMS capacitor sensors arranged in a bridge configuration.

In the first embodiment, the slope of the excitation 302 is reduced in order to avoid overly stimulating the resonant condition of MEMS sensor 103. FIG. 4 illustrates a comparison between a square wave excitation signal 402, and wave shaped excitation signal 404 that are used to stimulate MEMS sensor at input port Vex. As shown, output waveform 306 represents high amplitude ringing due to a square wave input 402 that contains steep slope at rising and falling edges because of the resonances stimulated by square wave excitation signal 402 having steep rising and falling edges causes resonance. The output waveform 408, on the other hand, represents the response from the wave shaped excitation signal 404 and exhibits very little ringing due to smooth edges at the falling and rising portion of the input as well as the transition region to the flat region. The smooth edges at the rising and falling portion of the excitation signal 404 reduces the effect of resonances due to high Q Factor of the MEMS sensors and capacitors and provide a more smoother output waveform 408.

In an embodiment, the slope of the excitation signal is controlled in the time domain by using cascaded integrators to control the rising and falling behavior of the excitation signal, while maintaining a flat output voltage between edge transitions. Accordingly, the first integration produces a triangular edge, while the second integration produces an edge having a second order or parabolic shape. The output of the second integration is used to drive a MEMS sensor 103 arranged in a bridge configuration. Such an embodiment shaping the reduces amplitude of the generated harmonics and reduces the ringing seen at the output of MEMS sensor 103. It should be understood that the cascaded integrator approach is just one example of many possible embodiment systems and methods that may be used to control the slope of the excitation signal. In some embodiments, the excitation signal has a time period in which the signal value is stable having, for example, a fixed reference voltage. This time period in which the time period is stable may also be referred to as a "flat region." Within this time period, the sensor output signal and readout amplifier output signal will also be stable and can be sampled, for example, by ADC 106 shown in FIG. 1.

Figure 5:
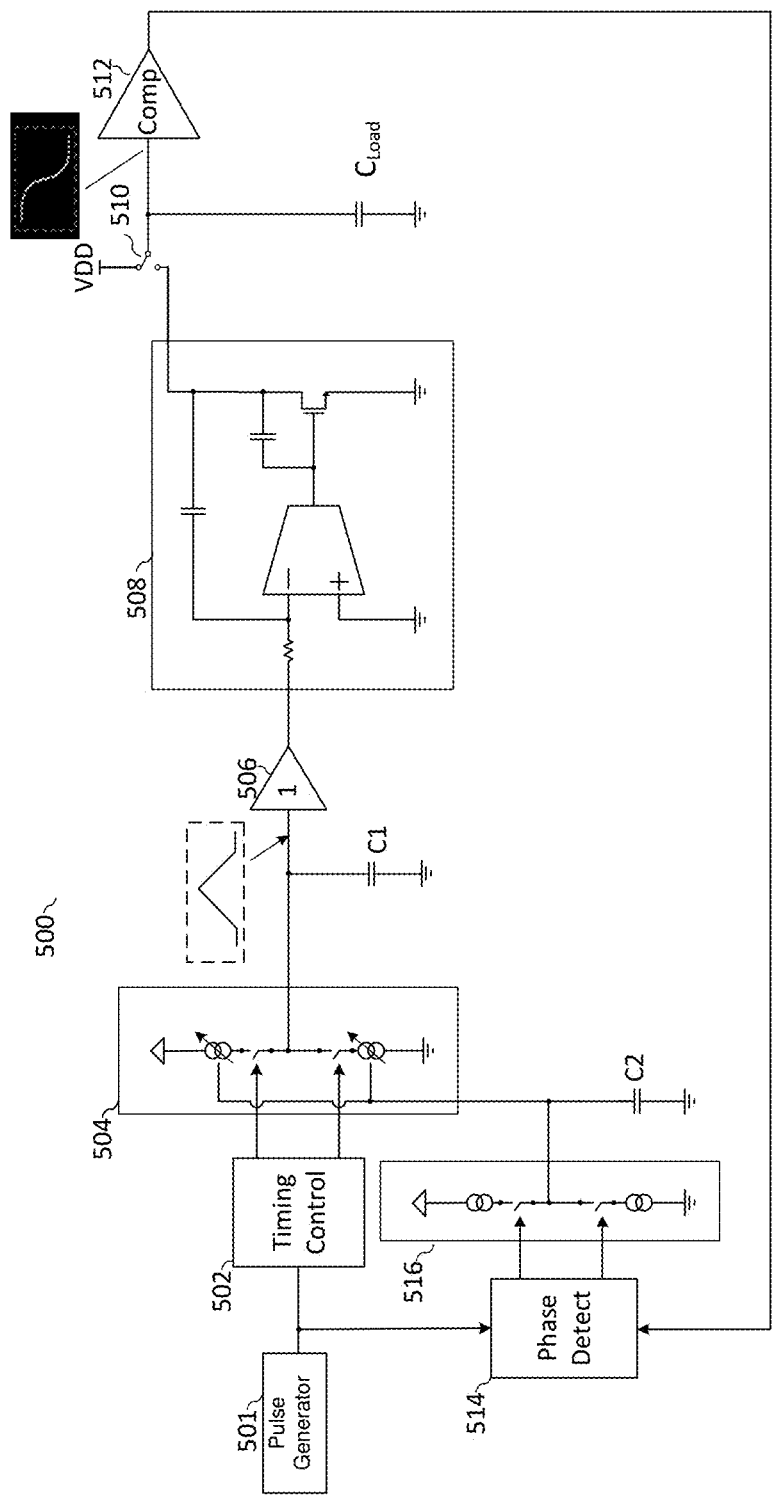
FIG. 5 illustrates an embodiment slope control circuit.

FIG. 5 illustrates an embodiment excitation pulse generation system 500 that includes a timing control circuit 502, a charge pump 504, a first integrating capacitor C1, a second integrator and wave shaper circuit 508, a switch 510 for controlling a second integrator output to be coupled to $C_{Load}$, a comparator 512, a phase detector 514, and second charge pump 516 driving a loop filter capacitor C2. The timing control circuit 502 accepts the input square wave signal or clock from pulse generator 501 and generates two switch control signals for driving the charge pump 504. These two switch control signals selectively activate switches that connect a charging or discharging current source to the integrating capacitor C1. The square wave clock signal is integrated across the integrating capacitor C1 and an integrated triangular waveform is generated. This integrated triangular waveform is buffered by the buffer amplifier 506. The buffered triangular waveform is further integrated to generate a wave shape that contains very low energy content at the resonant frequency of the MEMS capacitor. The second integration smoothens out the sharp edges present in a square waveform and the edge of the triangular wave form. It is understood that a square wave having sharp edges contain a lot of high frequency components that can stimulate a resonant response within MEMS sensor 103. The endpoints of the integrated wave shape is controlled to ensure that edges of the slope controlled output signal is synchronized with the input clock signal. A switch 510 is configured to couple the load capacitance CLoad to either the output of integrator and wave shaper circuit 508 or supply voltage VDD of this circuit block (which typically is a temperature stable and low noise reference voltage). In some embodiments, switch 510 is used to couple the load capacitance $C_{Load}$ to supply voltage VDD in case the output of second integrator and wave shaper 508 does not meet the supply voltage.

As shown in FIG. 5, the sloped controlled excitation signal runs though comparator 512 to form a signal that may be used to adjust the phase difference between input clock and the excitation signal. The phase of the signal at the output of comparator 512 is compared with the phase of the input clock signal via phase detector 514, which generates two control signals to activate two switches in a charge pump circuit 516. The switches connect a charging and a discharging current source to a loop filter capacitor C2. The voltage at the loop filter capacitor C2 is an indication of the phase difference between the excitation signal and the input clock signal. The loop filter capacitor C2 transforms an instantaneous phase difference to an analog voltage. This voltage is used to control the amplitude of the charging and discharging current while generating an integrated triangular waveform. In an embodiment, the excitation pulse generation system 500 can be implemented in a single integrated circuit (IC).

Figure 6:
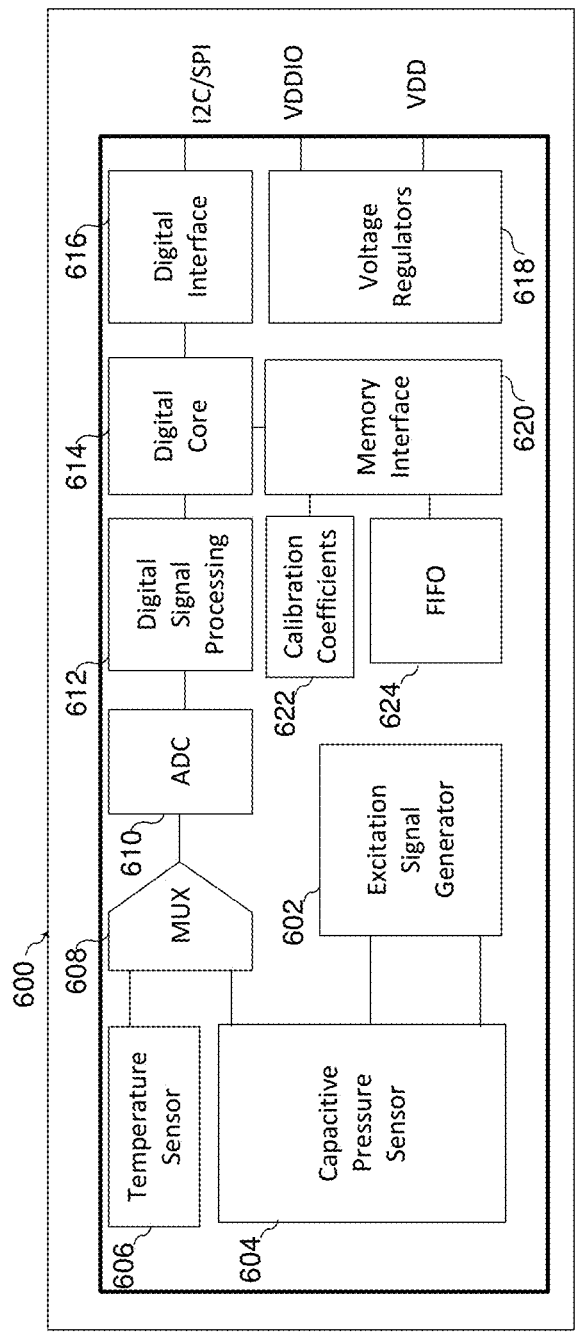
FIG. 6 illustrates an embodiment Digital Pressure Measurement system utilizing a slope control circuit.

FIG. 6 illustrates an embodiment Digital Pressure Measurement System 600 that includes embodiment excitation signal generator 602, a capacitive pressure sensor 604 (including the readout amplifier 104), a temperature sensor 606, a mux 608, an analog to digital converter (ADC) 610, a digital signal processing 612, a digital core 614, a digital interface 616, a voltage regulators 618, a memory interface 620, a unit storing calibration coefficients 622 and FIFO (First In First Out) 624. The excitation signal generator 602 provides the slope controlled excitation signal to the capacitive pressure sensor 604 according to embodiments described above. The mux 608 selects measurement from temperature sensor 606 or capacitor sensor 604 and sends to an ADC circuit 610 for digital conversion of the measurements. The ADC output is then passed through a digital signal processing unit 612 for further filtering and mathematical computation. The digital core 614 and the digital interface 616 are part of the internal processor that converts the temperature and pressure measurements into 24 bits of digital word. The calibration co-efficient 622 stores calibrated values for each individual pressure sensors to be used for measurement correction. The FIFO 624 stores multiple temperature and pressure measurements during low power mode. The memory interface 620 provides these values to digital core 614. The embodiment also includes an internal voltage regulator for supplying power to internal circuits.

In an embodiment, Digital Pressure Measurement System 600 may be implemented using a single integrated circuit and/or a combination of integrated circuits and/or discreet components. It should be appreciated that system 600 is just one of many example systems in which an embodiment excitation signal generator may be implemented.

Figure 7:
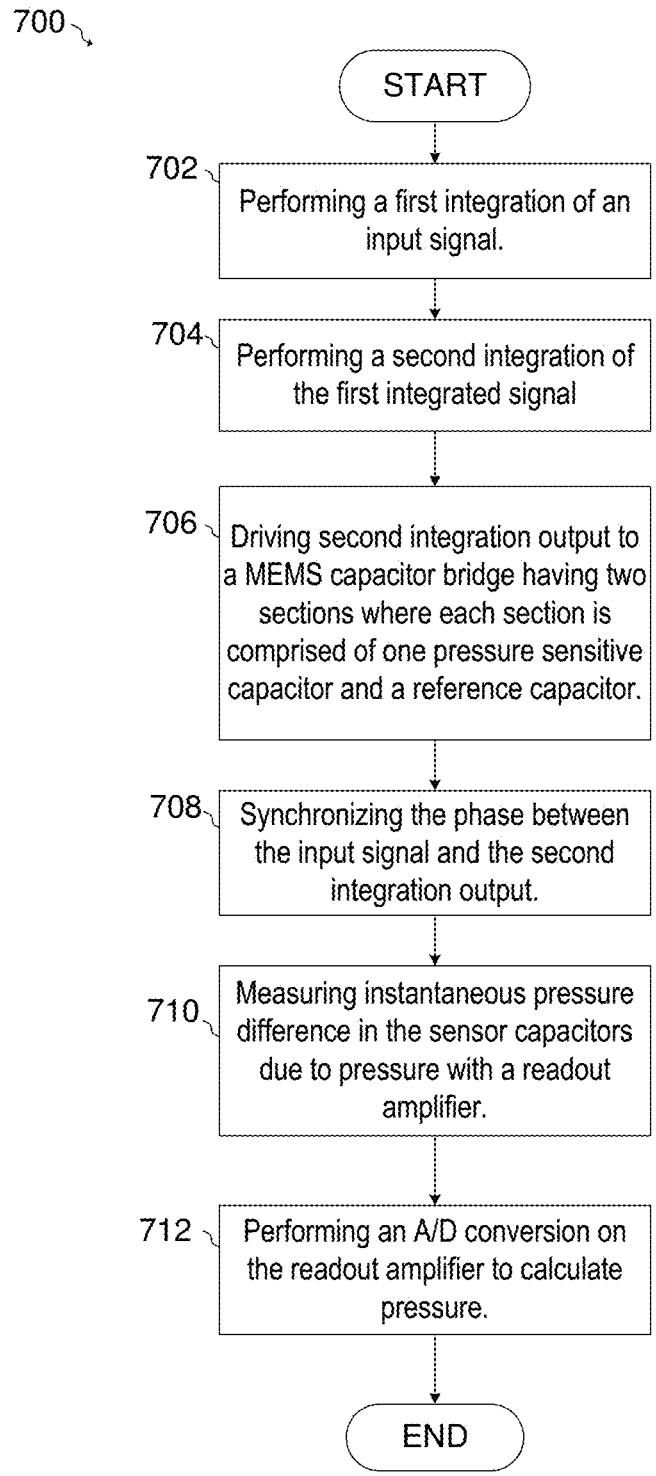
FIG. 7 illustrates a flow chart of an embodiment method.

FIG. 7 illustrates a flowchart of an embodiment method 700 of controlling slope of a MEMS capacitor. In step 702, a first integration is performed on a first input signal. In an embodiment the first input signal is a square wave signal. Next in step 704, a second integration is performed on the first integration output signal. In an embodiment, the first integration output is a triangular waveform and the second integration is performed for a wave shaping. When the output signal has reached the reference voltage (Vdd) or a certain amount of time has passed, the output is kept constant (eventually the output is switched to Vdd) until a falling edge procedure is triggered in some embodiments. Next in step 706, the output of the second integration is used to drive a MEMS capacitor bridge, where bridge is having two sections and each section is comprised of one pressure sensitive capacitor and one reference capacitor. Next in step 708, the phase of the input signal and output of the second integration are synchronized. In an embodiment, a phase detector is used to synchronize the phases. Next in step 710, a readout amplifier connected to the common point of the pressure sensitive capacitor and the reference capacitor is used to measure instantaneous capacitor changes. Finally in step 712, an A/D conversion is performed on the output of the readout amplifier to calculate the pressure.

In accordance with various embodiments, circuits or systems may be configured to perform particular operations or actions by virtue of having hardware, software, firmware, or a combination of them installed on the system that in operation causes or cause the system to perform the actions. One general aspect includes a method of performing a measurement with a capacitive sensor, the method including: generating a periodic excitation signal, the periodic excitation signal including a series of pulses; smoothing edge transitions of the series of pulses to form a shaped periodic excitation signal; providing the shaped periodic excitation signal to a first port of the capacitive sensor; and measuring a signal provided by a second port of the capacitive sensor. Other embodiments of this aspect include corresponding circuits and systems configured to perform the various actions of the methods.

Implementations may include one or more of the following features. The method further including determining an output measurement based on the measured signal. The method where the determined output measurement includes a pressure measurement. The method where smoothing edge transitions includes generating a first sloped signal based on the generated periodic excitation signal to form a sloped excitation signal. The method where smoothing edge transitions further includes integrating the sloped signal to form the shaped periodic excitation signal. The method further including adjusting a slope of the first sloped signal based on a timing difference between the shaped periodic excitation and the periodic excitation signal. The method where generating the first sloped signal includes charging a capacitor with a first current source and discharging the capacitor with a second current source. The method further including adjusting a slope of the first sloped signal based on a timing difference between the shaped periodic excitation and the periodic excitation signal, where adjusting the slope includes adjusting a current of the first current source and the second current source. The method further including determining the timing difference between the shaped periodic excitation signal and the periodic excitation signal. The method where determining the timing difference includes using a phase detector. The method where the capacitive sensor includes a MEMS sensor. The method where the MEMS sensor includes a sensor bridge having a first branch having a first MEMS pressure sensor and a first capacitor, and a second branch having a second MEMS pressure sensor and a second capacitor. Implementations of the described techniques may include hardware, a method or process, or computer software on a computer-accessible medium.

A further general aspect includes a system including: an excitation generator configured to be coupled to a first port of a capacitive sensor, the excitation generator including a pulse generator, and a pulse smoothing circuit coupled to an output of the pulse generator, where an output of the pulse smoothing circuit is configured to be coupled to the first port of the capacitive sensor. Other embodiments of this aspect include corresponding circuits and systems configured to perform the various actions of the methods.

Implementations may include one or more of the following features. The system further including a readout circuit configured to be coupled to a second port of the capacitive sensor. The system where the readout circuit includes an A/D converter configured to be coupled to the second port of the capacitive sensor. The system where the readout circuit is configured to determine a response of the capacitive sensor based on a signal emanating from the second port of the capacitive sensor. The system further including the capacitive sensor. The system where the capacitive sensor includes a MEMS sensor. The system where the MEMS sensor includes a sensor bridge having a first branch having a first MEMS pressure sensor and a first capacitor, and a second branch having a second MEMS pressure sensor and a second capacitor. The system where the pulse smoothing circuit includes a ramp generator having an input coupled to the output of the pulse generator. The system where the ramp generator includes a first current source and a second current source coupled to a first capacitor. The system where the pulse smoothing circuit further includes an integrator coupled to an output of the ramp generator, where an output of the integrator is coupled to the output of the pulse smoothing circuit. The system further including a phase detector having a first input coupled to the output of the pulse generator and a second input coupled to the output of the integrator, where an output of the phase detector is configured to control a slope of a signal at the output of the ramp generator. The system further including a charge pump coupled to an output of the phase detector, and a second capacitor coupled to an output of the charge pump. The system where the slope of the signal at the output of the ramp generator is based on a voltage across the second capacitor. The system where the excitation generator is disposed on an integrated circuit. The system where the capacitive sensor is further disposed on the integrated circuit. The system where the pulse smoothing circuit includes: a first integrator coupled to the output of the pulse generator; and a second integrator coupled to an output of the first integrator, where an output of the second integrator is coupled to an output of the pulse smoothing circuit. The system further including a phase detector having a first input coupled to the output of the pulse generator and a second input coupled to the output of the integrator, where an output of the phase detector is configured to control a slope of the first integrator. The system where the first integrator includes a plurality of current sources coupled to an integrating capacitor, and controlling the slope of the first integrator includes adjusting a current of the plurality of current sources based on the output of the phase detector. Implementations of the described techniques may include hardware, a method or process, or computer software on a computer-accessible medium.

An advantage of some implementations of the first embodiment includes the ability to reduce the effect of ringing when capacitive MEMS is enabled via an excitation signal. The amount of ringing is a function of the excitation signal wave shape and MEMS capacitor resonant frequency.

Second Embodiment

In the second embodiment, ADC 106 varies its internal sampling clock signal by a pseudo-random jitter to mitigate the effect of ringing noise. This pseudo-random jitter is provided by varying the timing of the rising and/or falling edge of the sampling clock on which ADC 106 derives its timing reference. Accordingly, the systematic ringing error of the outputs of the sensor 103 is thus converted to a wide-band signal, which the filter 108 may suppress by, for example, averaging many digital samples to form each combined measurement sample.

Figure 8:
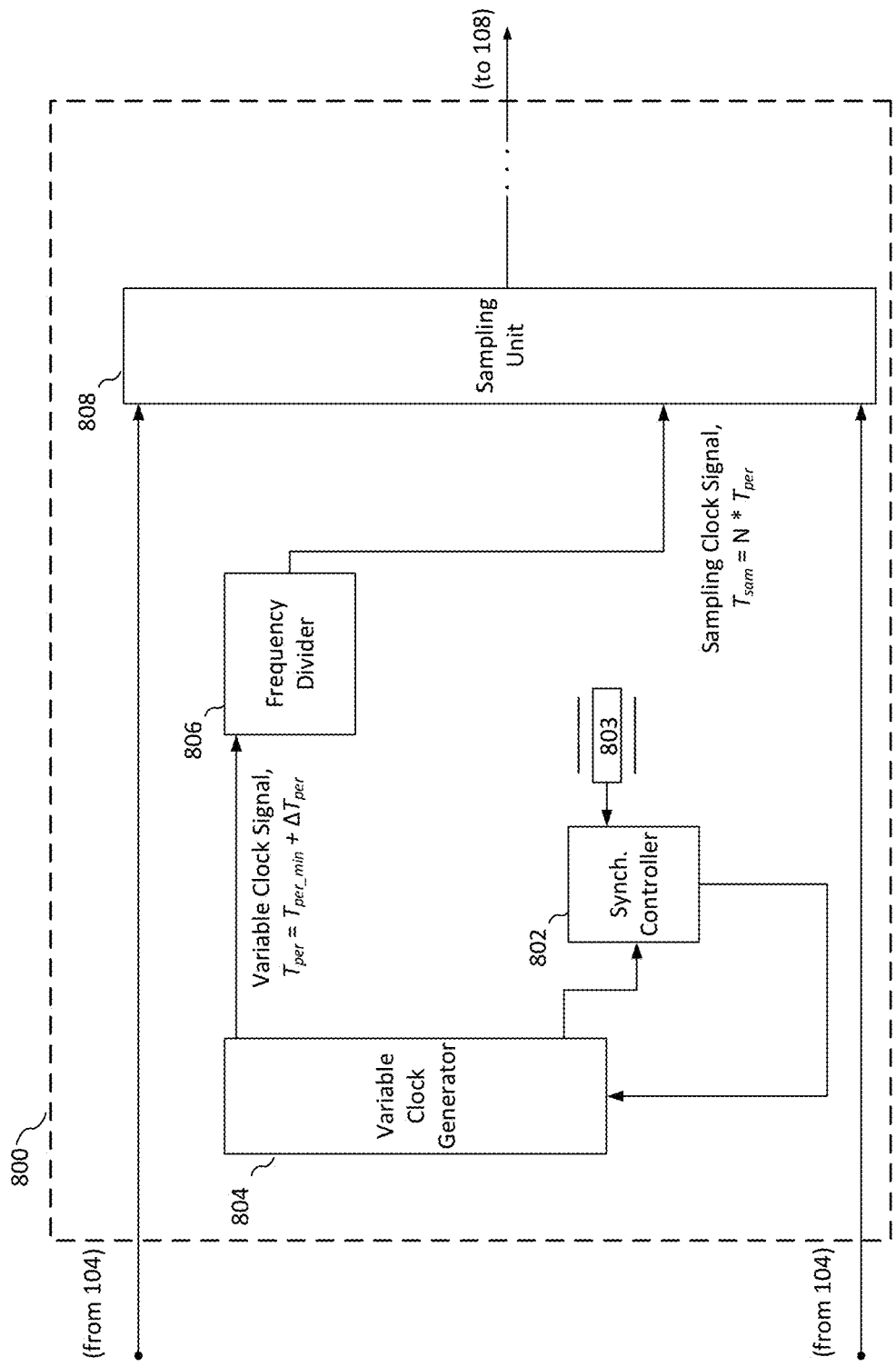
FIG. 8 is a block diagram illustrating an ADC that samples a differential response signal using pseudo-random sampling clock jitter in accordance with embodiments of the present invention.

FIG. 8 illustrates an example ADC 800 that may be used as the ADC 106 of FIG. 1 to generate a clock signal having pseudo-random jitter. ADC 800 includes a variable clock generator 804, a frequency divider 806, and a sampling unit 808.

The variable clock generator 804 generates a variable clock signal that has a pseudo-random jitter. The variable clock generator 804 includes this pseudo-random jitter in the variable clock signal by switching the length of the period $T_{per}$ of the variable clock signal. $T_{per}$ is equal to a minimum period $T_{per\_min}$ increased by a period adjustment $\Delta T_{per}$ that is switched every clock cycle of $T_{per}$. The sampling unit 808 receives a lower clock frequency through the clock frequency divider 806. For example, in the embodiment of FIG. 8, the clock frequency is an integer N times lower such that the effective sampling clock has a clock jitter of duration $T_{sw}$ that is equal to N times $\Delta T_{per}$. In an embodiment, $T_{sw}$ is chosen such that it randomly samples the MEMS signal having the resonance behavior at time points that are spread over at least one period $1/f_{res}$, $f_{res}$, where $f_{res}$ the resonant frequency of the MEMS sensor and the resonance period $T_{res}$ is the reciprocal of $f_{res}$. As an example, for a situation with $f_{res}$=5 MHz, $T_{res}$=200 ns, and N=8, $\Delta T_{per}$ is made to be less than 200 ns (preferably less than 200 ns/4) yet still high enough such that $T_{sw}$ is greater than 200 ns. In alternative embodiments, the clock frequency divider 806 may have another division ratio and/or the MEMS sensor may have a different resonant frequency.

The variable clock generator 804 is controlled in a feedback loop by a clock controller 802 to stabilize the average period $T_{per\_avg}$ of the variable clock signal. The clock controller 802 is provided a reference oscillator signal by a reference oscillator 803, which may be an oscillating crystal or any other form of stable electronic oscillator. In an embodiment, the clock controller 802 may include a phase-lock loop. In an embodiment, the clock controller 802 may provide the variable clock generator 804 a clock signal having a period that is different from the period of $T_{per\_min}$, which is then scaled in frequency by the variable clock generator 804. The variable clock generator 804 provides a clock feedback signal to the clock controller 802.

The frequency divider 806 is coupled to an output of the variable clock generator 804 and generates a sampling clock signal having a sampling period $T_{sam}$ that is N times the period $T_{per}$. The sampling clock signal therefore also includes a pseudo-random jitter.

An input of the sampling unit 808 is coupled to the output of the frequency divider 806 to receive the sampling clock signal. The sampling unit 808 also has inputs that receive the two amplified sensor response signals that are output from the readout amplifier 104 of FIG. 1. The sampling unit 808 generates samples by sampling a difference between these sensor response signals, and this sampling is performed every $T_{sam}$ seconds. These samples are quantized in one or more subsequent stages of the ADC (not shown) In an embodiment, the ADC is a sigma-delta converter, and the quantization stage(s) also include an additional loop filter that filters the output of the sampling unit.

Figure 9:
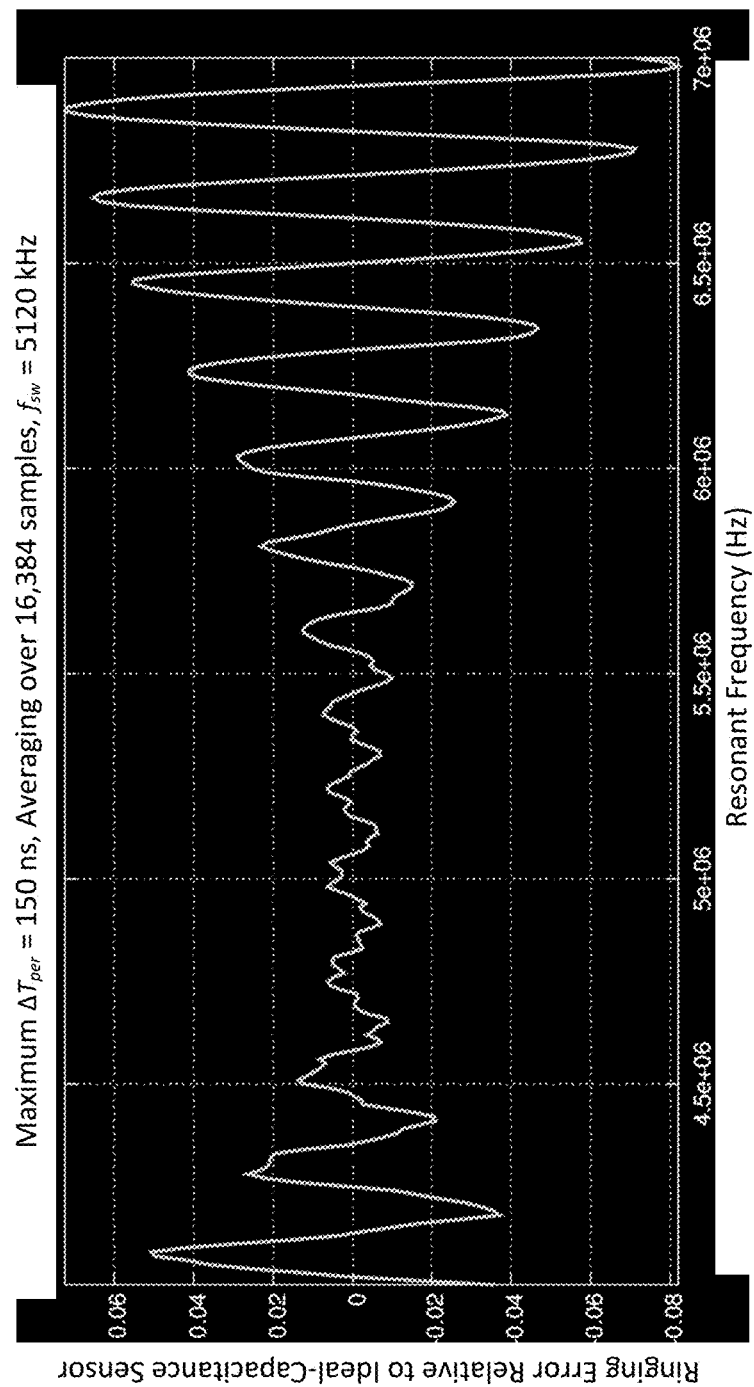
FIG. 9 is a graph illustrating the relative ringing error at a range of values for the resonant frequency of the MEMS-based sensor in accordance with embodiments of the present invention.

FIG. 9 shows a graph plotting the relative ringing error at an output of the filter 108 of FIG. 1. The maximum period shift of the sampling clock is 150 nanoseconds, 16,384 digital samples are averaged to form each measurement sample, and the switching frequency $f_{sw}$ is 5120 kHz. The ringing error is calculated relative to a resonance-free response signal of a sensor formed from ideal capacitors. This relative ringing error is minimized when the resonant frequency is equal to the switching frequency, and increases as the resonant frequency is varied away from the switching frequency in either direction.

Figure 10:
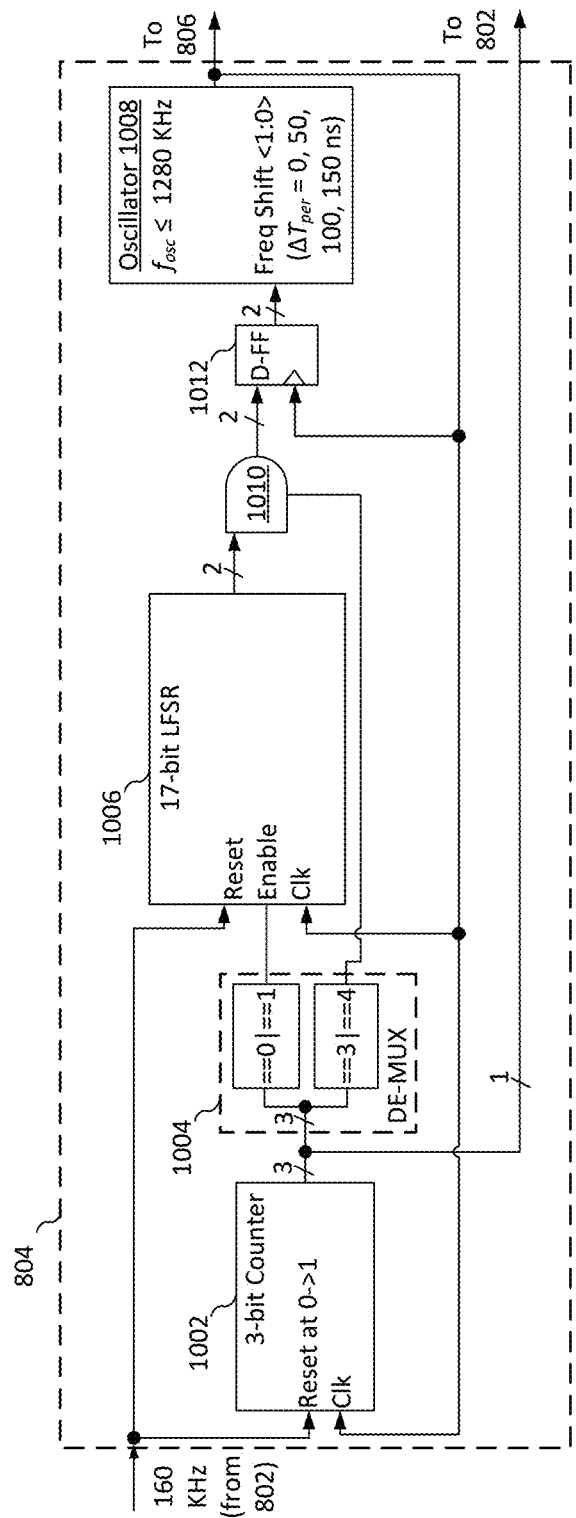
FIG. 10 is a block diagram illustrating a circuit that generates a variable clock signal having a pseudo-random jitter in accordance with embodiments of the present invention.

FIG. 10 shows a block diagram of an embodiment variable clock generator 804. The variable clock generator 804 includes a counter 1002, a de-multiplexer 1004, an LFSR 1006, and an oscillator 1008.

The counter 1002 has a counter reset input that receives a clock control signal from the clock controller 802. In the exemplary embodiment of FIG. 10, the frequency of this clock control signal is 160 kHz. The counter 1002 also has a counter clock input coupled to an output of the oscillator 1008 to receive a variable clock signal. In the embodiment of FIG. 10, the counter 1002 is a 3-bit counter that generates a counter signal that represents a count value incremented from 0 to 7 synchronously with the variable clock signal received from oscillator 1008, and the count value is reset to 0 by a rising edge on the counter reset input. The most significant bit of the counter signal is provided as the feedback control signal to the clock controller 802. This feedback control signal is one-eighth the frequency of the variable clock signal.

The de-multiplexer 1004 also has an input coupled to the output of counter 1002 to receive the counter signal. The de-multiplexer 1004 switches on or off a binary LFSR enable signal based on the count value. The de-multiplexer 1004 also switches on or off a first binary input to an AND gate 1010 based on the value of the counter signal.

In the example embodiment of FIG. 10, when the count value is 0 or 1, the de-multiplexer switches on the LFSR enable signal, and otherwise the de-multiplexer 1004 switches the LFSR enable signal off. When the count value is 3 or 4, the de-multiplexer switches on the first input to the AND gate 1010, and otherwise the de-multiplexer 1004 switches the AND gate 1010 off. Since the count value can take any one of eight possible values, the LFSR enable signal is therefore switched on during only the first quarter of the variable clock period of oscillator 1008, and the first input to the AND gate 1010 is switched on only during the next quarter of the oscillator clock period.

The LFSR 1006 includes an enable input that receives the LFSR enable signal from the de-multiplexer 1004. The LFSR 1006 also has a reset input that receives the clock control signal from clock controller 802 as an LFSR reset signal. The LFSR 1006 also includes a clock input that receives the variable clock signal that is output from the oscillator 1008. Based on the LFSR enable signal and the LFSR reset signal, the LFSR 1006 generates a pseudo-random sequence that is synchronous with the variable clock signal. In some embodiments, the LFSR 1006 is a Fibonacci LFSR. In other embodiments, the LFSR 1006 is a Galois LFSR. In still other embodiments, any pseudo-random sequence generator known in the art, including a non-linear feedback shift register, may be used in place of the LFSR 1006.

In the embodiment of FIG. 10, the LFSR 1006 is a 17-bit LFSR that outputs a LFSR state signal representing a two-bit binary state of the LFSR 1006. The LFSR 1006 provides this LFSR state signal bit-by-bit to a second binary input of the AND gate 1010. Based on this LFSR state signal and the signal at the first input of the AND gate 1010, the AND gate 1010 generates a frequency select signal that is also a two-bit binary sequence.

The clock generator 804 also includes a D flip-flop 1012 that receives this frequency select signal from AND gate 1010, and also receives the variable clock signal that is output from the oscillator 1008. The D flip-flop 1012 also has an output coupled to an input of the oscillator 1008, and the D flip-flop 1012 provides the frequency select signal to the oscillator 1008, bit-by-bit, synchronously with the variable clock signal.

The oscillator 1008 generates the variable clock signal, which the oscillator 1008 varies based on the frequency select signal that is provided by the D flip-flop 1012. The oscillator 1008 has an oscillating frequency $f_{osc}$, the maximum of which is the reciprocal of $T_{per\_min}$ (shown in FIG. 8). Based on the two-bit binary value of the frequency select signal that is received by the oscillator every two periods of the variable clock signal (i.e., every two oscillations), the oscillator 1008 either maintains its oscillating frequency $f_{osc}$ at its previous value or reduces its oscillating frequency by a frequency shift. Decreasing the frequency of the oscillator 1008 by this frequency shift corresponds to adding a period adjustment of $\Delta T_{per}$ to $T_{per\_min}$ to obtain the period $T_{per}$ of the variable clock signal.

In the embodiment of FIG. 10, the oscillator 1008 changes its frequency shift, at each switching time, by an amount that is a reciprocal of 50 nanoseconds, and the total frequency shift at any time is the reciprocal of a $\Delta T_{per}$ of either 0, 50, 100, or 150 nanoseconds. The maximum frequency $f_{osc}$ of the oscillator is equal to 1280 kHz, which corresponds to a minimum period of the variable clock signal of 781.25 nanoseconds.

In an example, the frequency of the variable clock generator 804 is eight times the frequency of the sampling clock (i.e., N=8), and thus a frequency shift is determined four times during each period $T_{sam}$ of the sampling clock. In this case, the oscillator 1008 may change its frequency shift from its previous value at each of four switching times during each period $T_{sam}$ of the sampling clock signal. In this example, the minimum of the sampling clock period $T_{sam}$ is eight times the minimum period of the variable clock signal of 781.25 nanoseconds, which is 6250 nanoseconds. This minimum duration of $T_{sam}$ corresponds to a maximum sampling clock frequency of 160 kHz in this example. When a frequency shift corresponding to a maximum $\Delta T_{per}$ of 150 nanoseconds is applied, the oscillator has a maximum period $T_{per}$ of 931.25 nanoseconds. Since the maximum of $T_{sam}$ is eight times this maximum $T_{per}$, or 7450 nanoseconds, which corresponds to a maximum sampling clock frequency of 134.2 kHz in this example. The expected mean of $\Delta T_{per}$ applied over a long time interval will be 75 nanoseconds. This expected mean is determined by averaging 0, 50, 100, and 150 nanoseconds, which are the pseudo-randomly selected values of $\Delta T_{per}$. The expected mean of $T_{per}$ is thus 856.25 nanoseconds, which corresponds in this example to a mean sampling clock period $T_{sam}$ of 6850 nanoseconds and a mean sampling frequency of 146.0 kHz.

Figure 11:
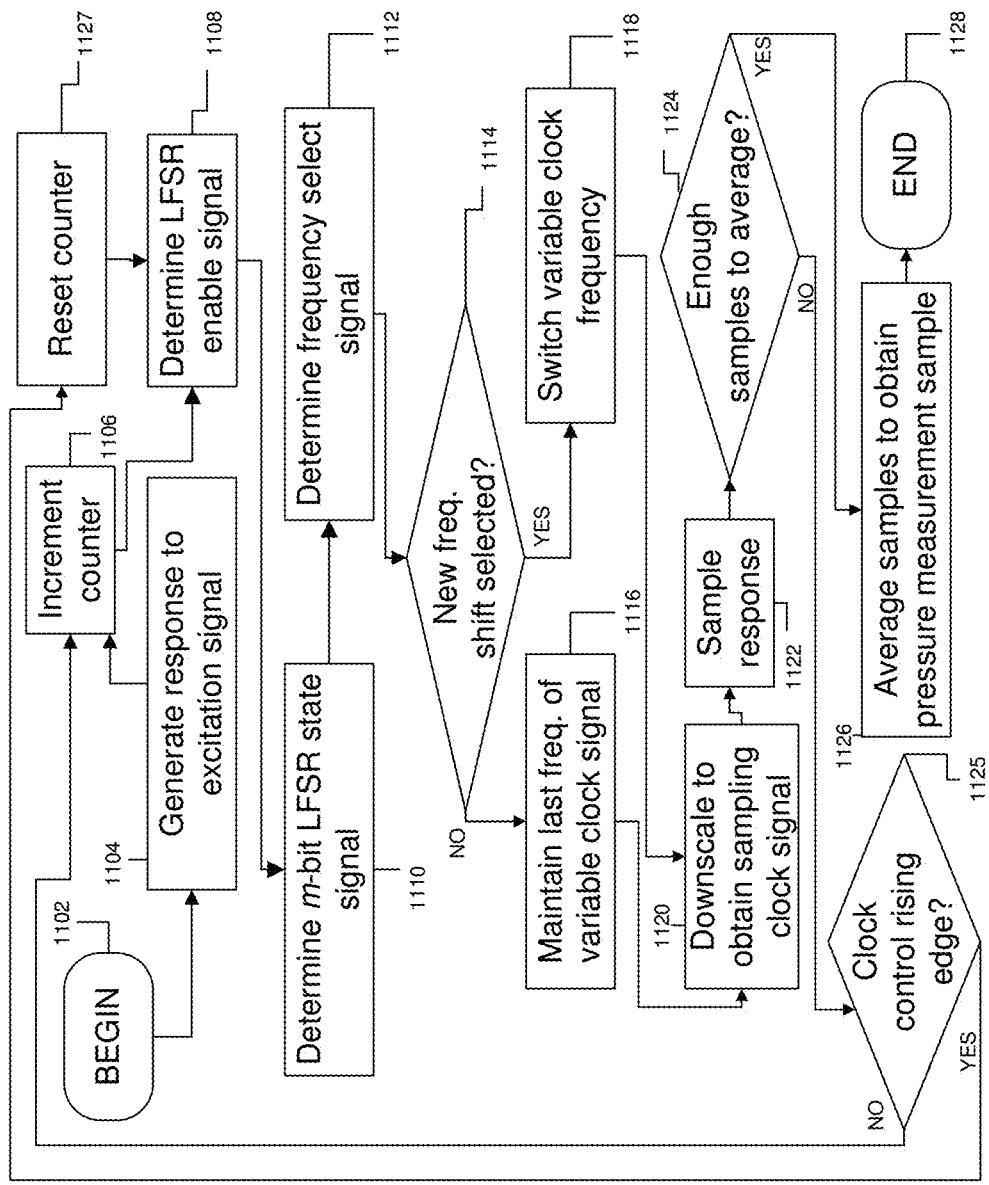
FIG. 11 is a flow diagram illustrating a measurement method in accordance with embodiments of the present invention.

FIG. 11 is a flow diagram illustrating an embodiment measurement method. The method begins at step 1102. At step 1104, sensor 103 generates response signals in response to an excitation signal. At step 1106, a counter signal is incremented synchronously with a variable clock signal. At step 1108, an LFSR enable signal is determined in accordance with count values of the counter signal. At step 1110, an m-bit LFSR state signal is determined synchronously with the variable clock signal in accordance with the LFSR enable signal and a clock control signal. At step 1112, a frequency select signal is determined in accordance with the LFSR state signal and a count value of the counter signal.

At step 1114, a flow decision is made based on whether a new frequency shift that is different from the previous frequency shift has been selected by the frequency select signal. If a new frequency shift has been selected, flow continues at step 1118, where the frequency of the variable clock signal is switched in accordance with the selected frequency shift. Otherwise, flow continues at step 1116, where the last frequency of the variable clock signal is maintained. Flow then continues in either case at step 1120, where the variable clock signal is downscaled in frequency by a factor of N to obtain a sampling clock signal. At step 1122, the response signals generated by sensor 103 are sampled in accordance with the sampling clock signal.

At step 1124, a flow decision is made based on whether enough samples have been collected to perform an averaging operation. This requisite number of samples may be based on a design setting, for example. If not enough samples have been collected, flow continues at step 1125, where another flow decision is made based on whether the clock control signal has a rising edge. If a rising edge is not detected, flow continues at step 1106.

If a rising edge is detected at step 1125, flow continues at step 1127, where the counter is reset to 0. Flow then continues at step 1108.

If enough samples for averaging have been collected at step 1124, flow continues at step 1126, where these samples are averaged together to obtain a combined pressure measurement sample. The method then ends at step 1128.

In accordance with various embodiments, circuits or systems may be configured to perform particular operations or actions by virtue of having hardware, software, firmware, or a combination of them installed on the system that in operation causes or cause the system to perform the actions. One general aspect includes a measurement method, including: generating, by a sensor including a micro-electro-mechanical systems (MEMS) element, a response signal in response to an excitation signal; generating a sampling clock signal in accordance with a pseudo-random jitter; sampling the response signal in accordance with the sampling clock signal to determine a plurality of digital samples; and combining the plurality of digital samples to form a measurement sample. Other embodiments of this aspect include corresponding circuits and systems configured to perform the various actions of the methods.

Implementations may include one or more of the following features. The method where: the generating the sampling clock signal includes generating a variable clock signal having a variable clock frequency that switches in accordance with a switching frequency; and a period of the sampling clock signal is an integer multiple of a period of the variable clock signal. The method where: the excitation signal includes a square wave; and the MEMS element includes a first pressure-sensitive capacitor. The method where the generating the variable clock signal includes: generating, by a linear feedback shift register (LFSR), a LFSR state signal in accordance with the variable clock signal and a reference oscillator signal. The method where: the generating the variable clock signal further includes: generating a counter signal in accordance with the variable clock signal and the reference oscillator signal; generating an LFSR enable signal in accordance with the counter signal; and generating a frequency select signal in accordance with the LFSR state signal and the counter signal; the generating the LFSR state signal is further in accordance with the LFSR enable signal; and the generating the variable clock signal is further in accordance with the frequency select signal. The method where: the sensor further includes a capacitance bridge, the capacitance bridge including a first bridge section and a second bridge section; the second bridge section includes a second pressure-sensitive capacitor and a third capacitor; the first bridge section includes the first pressure-sensitive capacitor and a fourth capacitor; and the response signal includes an output signal of the first bridge section and an output signal of the second bridge section. The method where the combining the plurality of digital samples includes averaging the plurality of digital samples. The method where: the switching frequency is not less than 0.9 times a mechanical resonant frequency of the MEMS element; and the switching frequency is not greater than 1.1 times the mechanical resonant frequency of the MEMS element. Implementations of the described techniques may include hardware, a method or process, or computer software on a computer-accessible medium.

One general aspect includes a measurement circuit including a sensor, where: the sensor includes a micro-electro-mechanical systems (MEMS) element; the circuit is configured to: generate a response signal in response to an excitation signal; generate a sampling clock signal in accordance with a pseudo-random jitter; sample the response signal in accordance with the sampling clock signal to determine a plurality of digital samples; and combine the plurality of digital samples to form a measurement sample.

Other embodiments of this aspect include corresponding circuits and systems configured to perform the various actions of the methods.

Implementations may include one or more of the following features. The circuit further configured to: generate a variable clock signal having a variable clock frequency that switches in accordance with a switching frequency, where a period of the sampling clock signal is an integer multiple of a period of the variable clock signal. The circuit where: the excitation signal includes a square wave; and the MEMS element includes a first pressure-sensitive capacitor. The circuit further including a linear feedback shift register (LFSR) configured to generate a LFSR state signal in accordance with the variable clock signal and a reference oscillator signal. The circuit where: the circuit is further configured to: generate a counter signal in accordance with the variable clock signal and the reference oscillator signal; generate the variable clock signal in accordance with a frequency select signal; generate an LFSR enable signal in accordance with the counter signal; and generate the frequency select signal in accordance with the LFSR state signal and the counter signal; and the LFSR is further configured to generate the LFSR state signal in accordance with the LFSR enable signal. The circuit where: the sensor further includes a capacitance bridge, the capacitance bridge including a first bridge section and a second bridge section; the second bridge section includes a second pressure-sensitive capacitor and a third capacitor; the first bridge section includes the first pressure-sensitive capacitor and a fourth capacitor; and the response signal includes an output signal of the first bridge section and an output signal of the second bridge section. The circuit further configured to average the plurality of digital samples to form the measurement sample. The circuit where: the switching frequency is not less than 0.9 times a mechanical resonant frequency of the MEMS element; and the switching frequency is not greater than 1.1 times the mechanical resonant frequency of the MEMS element. Implementations of the described techniques may include hardware, a method or process, or computer software on a computer-accessible medium.

One general aspect includes a measurement device, including: a micro-electro-mechanical systems (MEMS) element; an analog-to-digital converter (ADC) coupled to an output of the MEMS element, the ADC including: a pseudo-random sequence generator; and a first oscillator including an input coupled to an output of the pseudo-random sequence generator; and a filter including an input coupled to an output of the ADC. Other embodiments of this aspect include corresponding circuits and systems configured to perform the various actions of the methods.

Implementations may include one or more of the following features. The device where the ADC includes a frequency divider coupled between an output of the first oscillator and the filter input. The device further including a square wave generator, the square wave generator including an output coupled to an input of the MEMS element, where the MEMS element includes a first pressure-sensitive capacitor. The device where the pseudo-random sequence generator further includes a linear feedback shift register (LFSR). The device where: the pseudo-random sequence generator further includes a counter and a logic network; the counter includes: a counter reset input coupled to an output of a reference oscillator; and a counter clock input coupled to the first oscillator output; the LFSR includes: an enable input coupled to an output of the counter; an LFSR reset input coupled to the reference oscillator output; an LFSR clock input coupled to the first oscillator output; and an LFSR output coupled to the first oscillator input; and the logic network includes: a first logic input coupled to the counter output; a second logic input coupled to the LFSR output; a first logic output coupled to the enable input of the LFSR; and a second logic output coupled to the first oscillator input. The device further including a capacitance bridge, where: the capacitance bridge includes a first bridge section and a second bridge section; the second bridge section includes a second pressure-sensitive capacitor and a third capacitor; and the first bridge section includes the first pressure-sensitive capacitor and a fourth capacitor. The device where the filter includes a low-pass filter. The device where the device occupies a volume that is not greater than 10 cubic millimeters. The device may also include measurement system and method using micro-electro-mechanical systems with sampling jitter Implementations of the described techniques may include hardware, a method or process, or computer software on a computer-accessible medium.

Illustrative embodiments of the present invention have the advantage of suppressing narrow-band noise caused by resonance. An embodiment system may use, for example, a pseudo-random sampling clock jitter to increase the width of the noise band so that it may be more easily filtered out.

Third Embodiment

In the third embodiment, the MEMS pressure sensor is implemented using an array or MEMS pressure sensors that have varying dimensions, such that each of the MEMS pressure sensors resonate at different frequencies. Hence, when the MEMS pressure sensors are stimulated by the excitation signal, the amplitude of the ringing may be reduced at various times due to the various resonant responses being out of phase with each other. This is the case since the individual resonance signals are added, for example, by connecting the sensors electrically in parallel. In order to reduce the ringing caused by an underdamped response of the MEMS pressure sensors are designed with an array of MEMS capacitive pressure sensors. Each capacitive pressure sensor is designed with different dimensions such that the harmonic frequency for each capacitive sensor element is different than others in the array. When excited with a square wave excitation signal, each capacitive sensor element will ring with different resonant frequencies and attenuate harmonics that may stimulate the underdamped response of the MEMS pressure sensor.

Figures 12A, 12B:
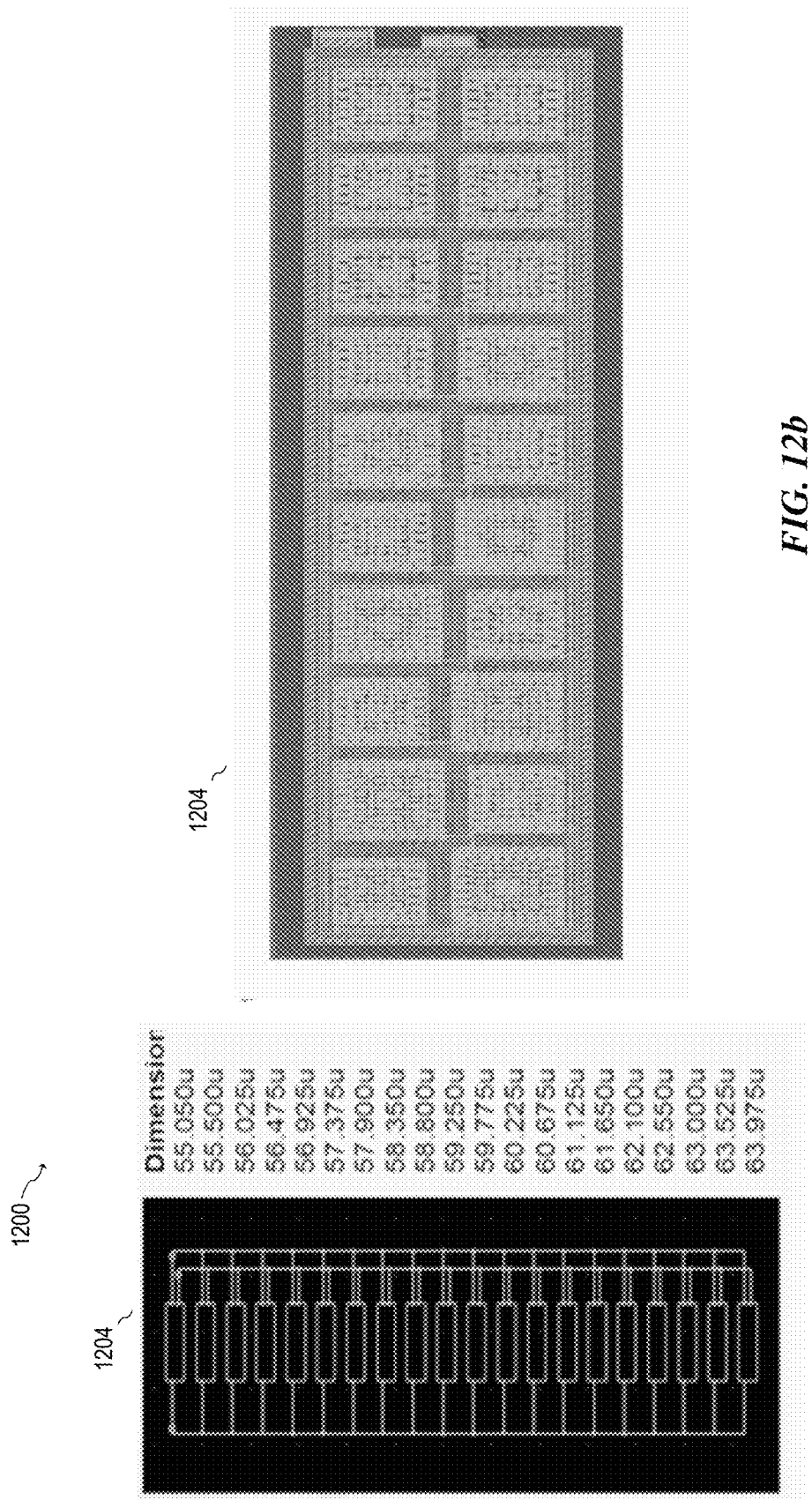
FIGS. 12a and 12b illustrate a MEMS capacitor array schematic and layout showing the different dimensions and the location.

FIG. 12a show a schematic of a pressure sensitive MEMS array 1202 and FIG. 12b shows a corresponding layout configuration 1204 of the MEMS array that includes twenty cells connected in parallel. Each unit cell is designed with different dimensions to have different resonant frequency. For example, as shown in FIG. 12a, the first MEMS cell has a dimension of 55.050 µm per side, the second MEMS cell has a dimension of 55.500 µm per side and the last MEMS cell has a dimension of 63.975 µm per side for a total spread of +/−7.5%. It should be understood that the example of FIGS. 12a and 12b is just one of many possible embodiment implementations. In alternative embodiments of the present invention, the total spread may be different, as well as how the device sizes are distributed.

Since each of the MEMS cells has a different dimension, each of the MEMS cells has a different resonant frequency. Thus, each MEMS cell rings at a different frequency when stimulated by the input excitation signal. At certain time periods, the ringing amplitude may be small due to destructive interference, or the ringing amplitude may be larger due to constructive interference. In various embodiments, ringing is reduced compared to an assembly with an equally sized MEMS. In an embodiment, the sizes of the MEMS cells are chosen such that the resonant frequencies of the MEMS cells are spread out such that the output of the MEMS cells may be measured and/or samples during suitable time periods in which destructive interference occurs in order to reduce or minimize measurement error due to the ringing response of the MEMS cells.

In embodiments of the present invention, the total geometrical spread between the smallest and the largest MEMS sensor cell, as well as how the cell sizes are distributed may be determined by performing simulations to determine how a size spread for a particular MEMS sensor cell effects a reduction in ringing for the composite response. In one specific embodiment, the variation of the dimension of each cell is limited within 7.5%. However, this is just one example and in alternative embodiments of the present invention, the limit of variation of the dimension may be greater or less than 7.5%.

Figure 13:
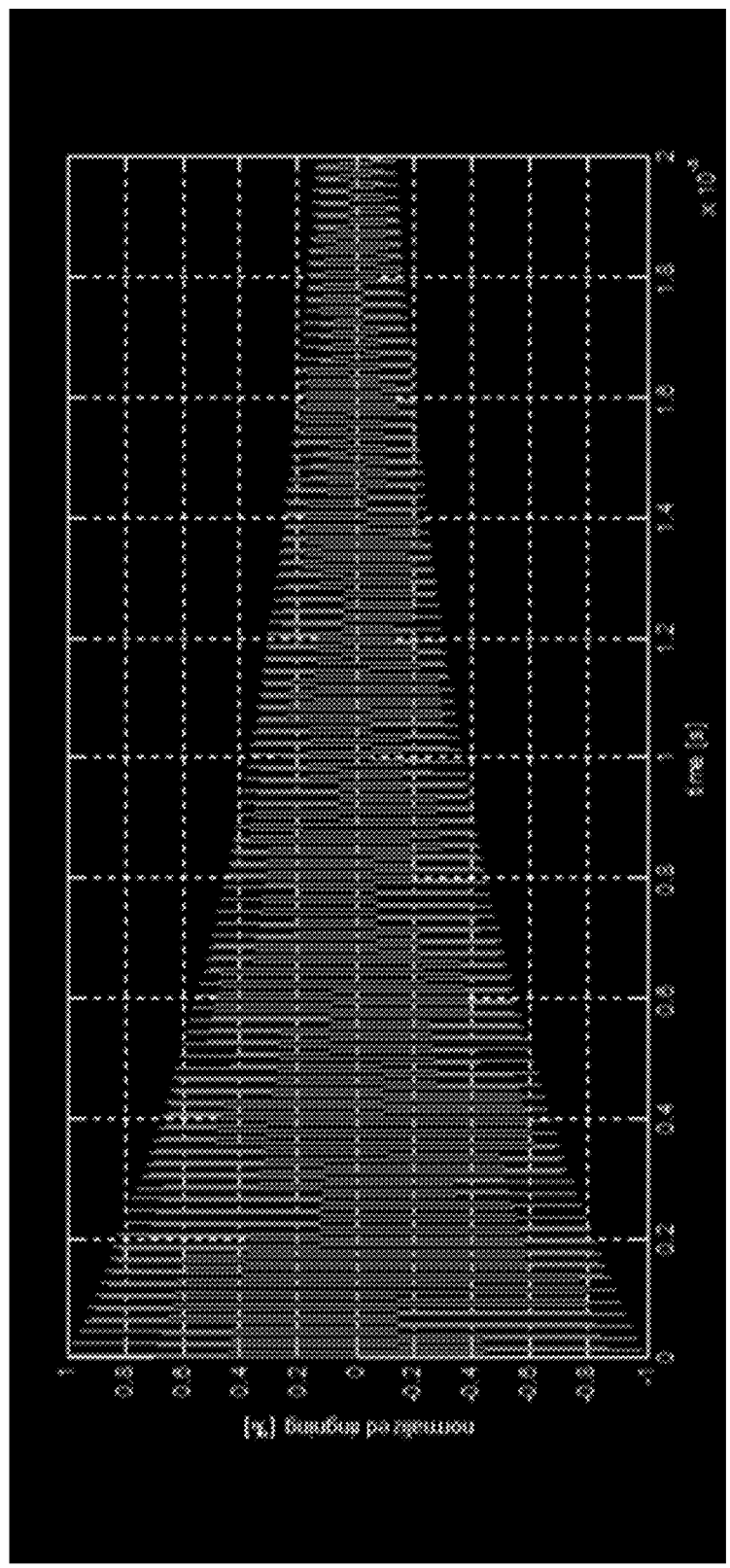
FIG. 13 is a graph illustrating output waveforms for square wave excitation signal driving a MEMS capacitor sensors array having same sizes and resonant frequencies.

FIG. 13 shows a graph of output waveform utilizing a MEMS pressure sensor which includes each MEMS cell has the same dimension and same resonant frequency. The horizontal axis represents the time in milliseconds and vertical axis represents a normalized value of output. The wave form 1300 shows normalized amplitude of the output ringing when excited with a square wave input excitation signal. The waveform indicates the longer settling time and larger amplitude of the ringing.

Figure 14:
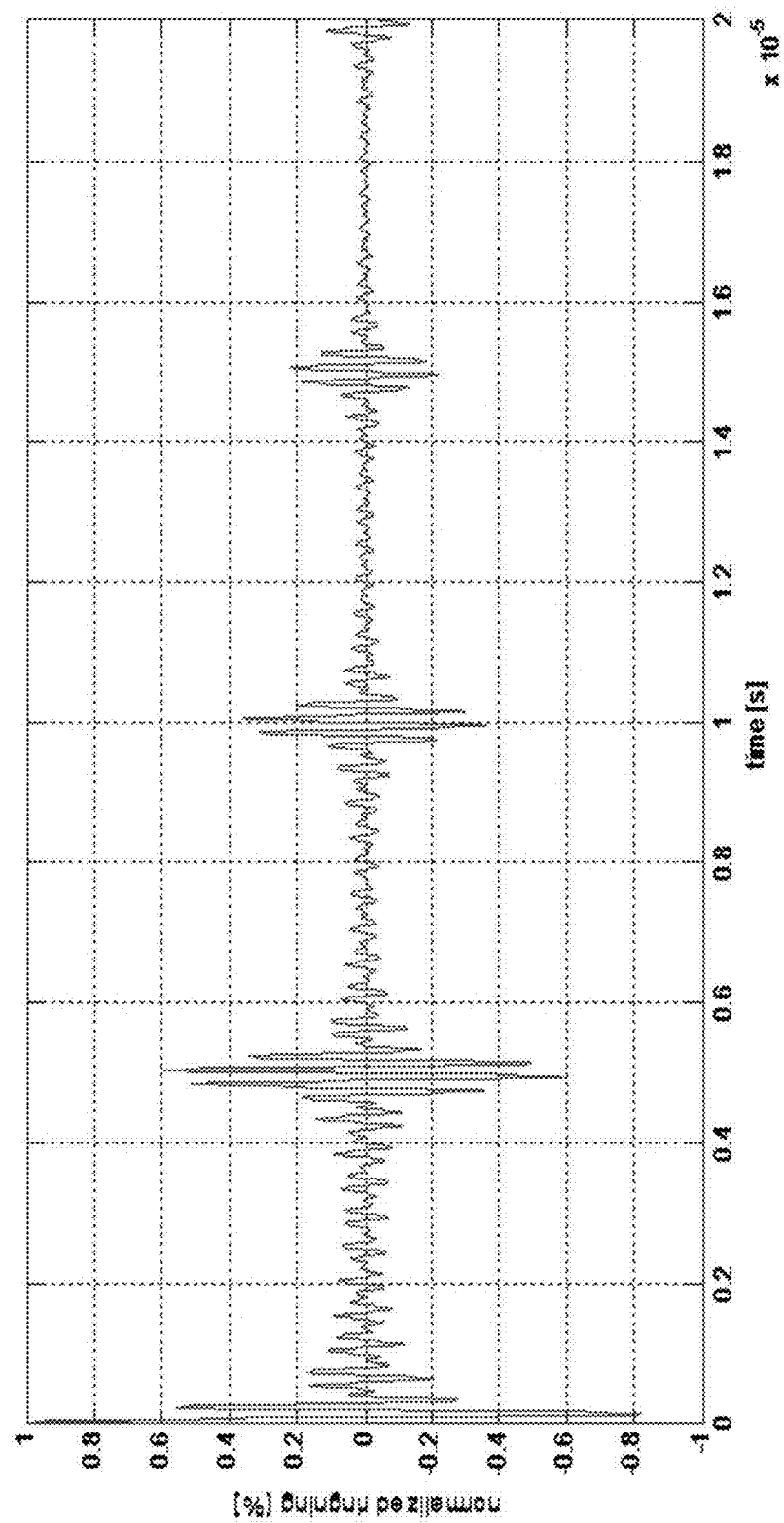
FIG. 14 is a graph illustrating output waveforms for square wave excitation signal driving the MEMS capacitor sensors array having different sizes and resonant frequencies.

FIG. 14 shows a graph of an output waveform that utilizes the MEMS pressure sensor having different dimensions for each unit cell and resonant frequencies spread out. The horizontal axis represents time in seconds and vertical axis represents normalized value of output. As shown, the settling time of the time response is fast than the embodiment represented by the graph of FIG. 13, in which all MEMS cells have the same dimension. In an embodiment, the ADC may sample the output of the MEMS pressure sensor at times during which the ringing response is at a minimum. In the specific embodiment represented by the graph of FIG. 14, such times may include, for example, between about 2 μs and about 4 μs or between 6 μs and 9 μs when the normalized ringing response is less than 0.1%. In alternative embodiments, other settling times and sampling periods may be used depending on the particular embodiment and its specifications. Thus, in various embodiments, the MEMS resonance frequency and the sampling clock frequency can vary over time or temperature or supply voltage without losing the benefit of this embodiment method.

Figure 15:
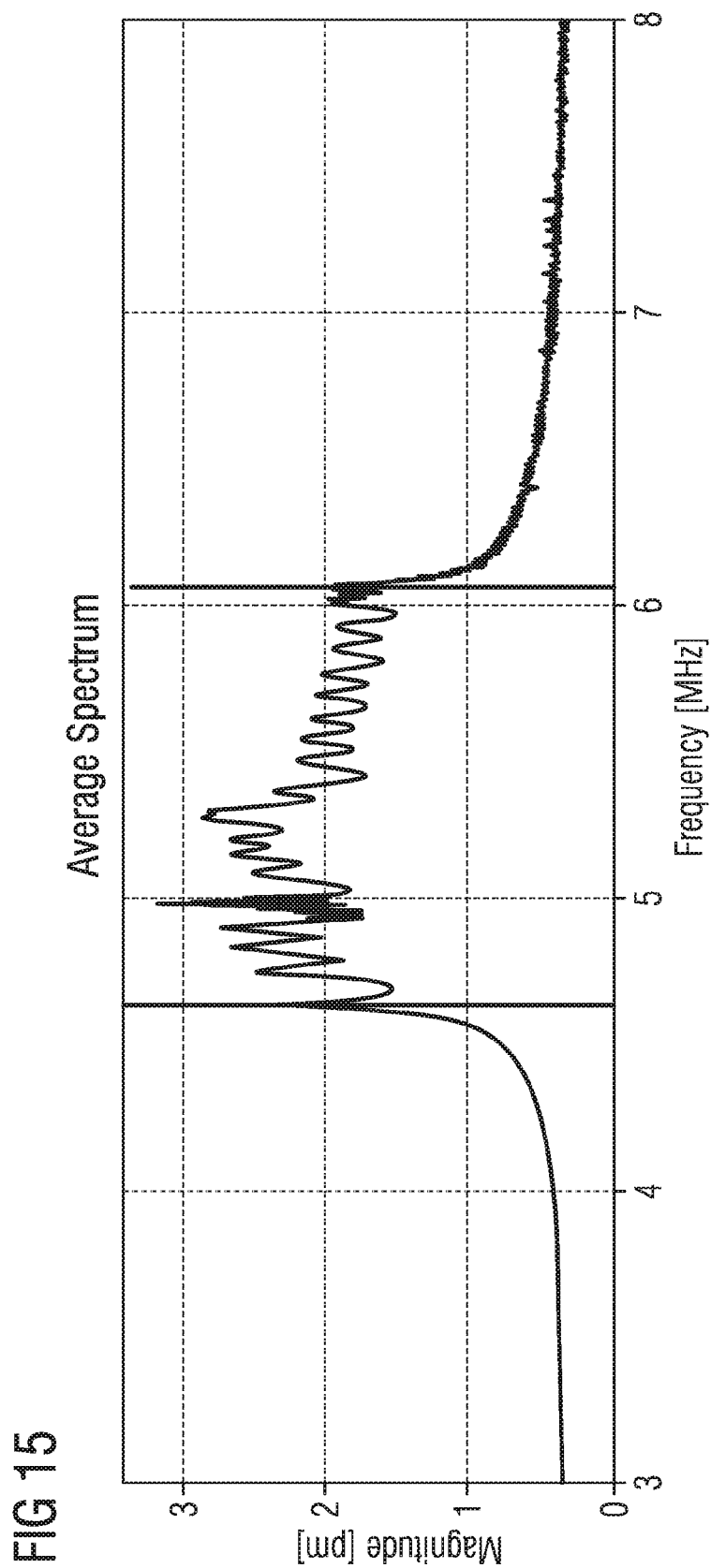
FIG. 15 is a graph illustrating frequency spectrum of the output wave form from the MEMS capacitor sensors array having different sizes and resonant frequencies.

FIG. 15 shows a graph of frequency spectrum of an output waveform where the resonant frequencies are spread out. The horizontal axis represents frequency and vertical axis represents magnitude. In an embodiment, the resonant frequencies are spread out between 4.5 MHz to 6.2 MHz.

Figure 16:
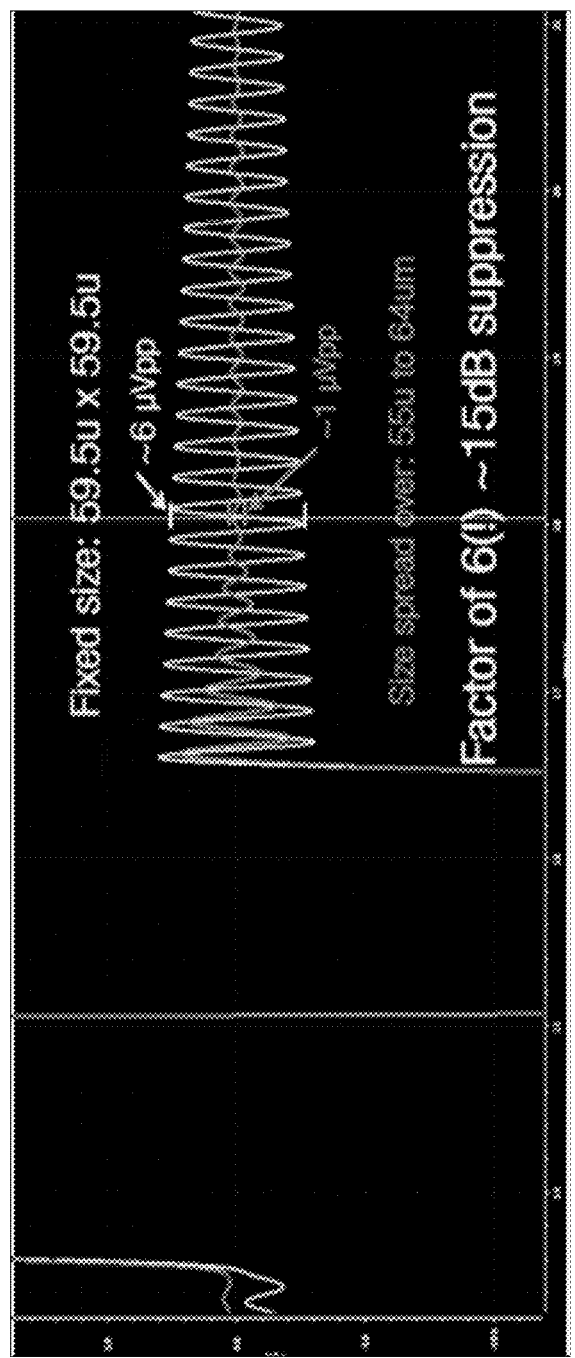
FIG. 16; is a graph illustrating a ringing amplitude for output wave forms from the MEMS capacitor sensors array having same dimensions and resonant frequencies and MEMS capacitor sensors array having different dimensions and resonant frequencies.

FIG. 16 shows a comparison graph that includes two simulated waveforms representing the output voltage ringing. The waveform 1602 is of an embodiment that includes a MEMS pressure sensor array where each unit cell is having same dimension and resonant frequency, and waveform 1604 is of an embodiment that includes a MEMS pressure sensor array where each unit cell has different dimension. The waveform 1602 shows ringing amplitude around 6 uV peak to peak, and waveform 1604 shows ringing amplitude around 1 uV peak to peak.

In accordance with various embodiments, circuits or systems may be configured to perform particular operations or actions by virtue of having hardware, software, firmware, or a combination of them installed on the system that in operation causes or cause the system to perform the actions. One general aspect includes a method of performing a measurement using a micro-electro-mechanical system (MEMS) sensor including MEMS sensors coupled in a bridge configuration, where a plurality of the MEMS sensors include a different resonant frequencies, the method including: applying an excitation signal to a first port of the bridge configuration, where each of the plurality of the MEMS sensors is stimulated by the excitation signal; measuring a signal at a second port of the bridge configuration; and determining a measured value based on the measuring the signal. Other embodiments of this aspect include corresponding circuits and systems configured to perform the various actions of the methods.

Implementations may include one or more of the following features. The method where the MEMS sensor includes a MEMS pressure sensor and the measured value includes a pressure. The method where the bridge configuration includes a first branch having a first group of the MEMS sensors coupled to a first capacitor, and a second branch having a second group of MEMS sensors coupled to a second capacitor. The method wherein each of the plurality of the MEMS sensors includes different size dimensions. The method where the size dimensions vary by about +/−7.5%. The method where the size dimensions are evenly distributed. The method where measuring a signal at a second port of the bridge configuration includes performing an A/D conversion. The method where a transient response of the bridge configuration includes ringing at the different resonant frequencies, and the ringing includes time intervals of constructive interference and intervals of destructive interference. The method where measuring a signal at a second port of the bridge configuration includes measuring the signal at the second port of the bridge configuration during an interval of destructive interference. The method where measuring the signal further includes sampling the signal during the interval of destructive interference. The method where measuring the signal further includes performing an A/D conversion of the signal during the interval of destructive interference. Implementations of the described techniques may include hardware, a method or process, or computer software on a computer-accessible medium.

One general aspect includes a system including: a micro-electro-mechanical system (MEMS) sensor array including a bridge, the bridge including a first bridge section and a second bridge section, where the first bridge section includes a first pressure sensitive MEMS sensor coupled to a first reference MEMS capacitor, where the first pressure sensitive MEMS sensor includes a first array of multiple MEMS sensors having different resonant frequencies. Other embodiments of this aspect include corresponding circuits and systems configured to perform the various actions of the methods.

Implementations may include one or more of the following features. The system where the second bridge section includes a second pressure sensitive MEMS sensor coupled to a second reference MEMS capacitor, where the second pressure sensitive MEMS sensor includes a second array of multiple MEMS sensors having different resonant frequencies. The system where: the multiple MEMS sensors of the first array are coupled in parallel; and the multiple MEMS sensors of the second array are coupled in parallel. The system where the multiple MEMS sensors of the first array are rectangular. The system where multiple MEMS sensors of the first array each have different dimensions. The system where the different dimensions include different lengths. The system where the different lengths have a variation of about +/−7.5%. The system further including: an excitation generator having an output coupled to a first port of the MEMS sensor array; and a measurement circuit having an input coupled to a second port of the MEMS sensor array. The system where the measurement circuit includes an A/D converter. The system further including a filter coupled to an output of the A/D converter. The system where the filter includes a low pass filter. Implementations of the described techniques may include hardware, a method or process, or computer software on a computer-accessible medium.

An advantage of some embodiments includes the ability to reduce the effect of ringing when capacitive MEMS array is designed with MEMS cells having different dimensions and resonant frequencies.

Fourth Embodiment

In a fourth embodiment, an oversampled analog to digital converter (ADC) is used to monitor the output of the MEMS sensor. In order to alleviate idle tones in the oversampled ADC, a dithered clock is used to operate the oversampled ADC. In some embodiments, the dither clock signal may be generated according to the second embodiment disclosed herein.

According to various embodiments, the conversion of the analog signal into the digital domain is performed using a sigma-delta analog to digital converter (ADC). Various embodiment sigma-delta ADCs include feedback and reference voltage supplies. For pressure sensing, the measured signal is generally at very low frequencies near DC. For example, pressure sensing may measure input signals from 0 to 10 Hz. The inventors have determined that idle tones present in the sigma-delta ADC interact with noise in the reference voltage supply in a multiplicative manner to produce an error component at DC. In various embodiments, the sigma-delta ADC is provided with a dithered clock in order to spread the noise components and reduce or remove the error component at DC. In such embodiments, the dithered clock is used as a system clock for the interface circuit including, for example, the voltage supply circuit, the sigma-delta ADC, an output filter, or other components.

Figure 17:
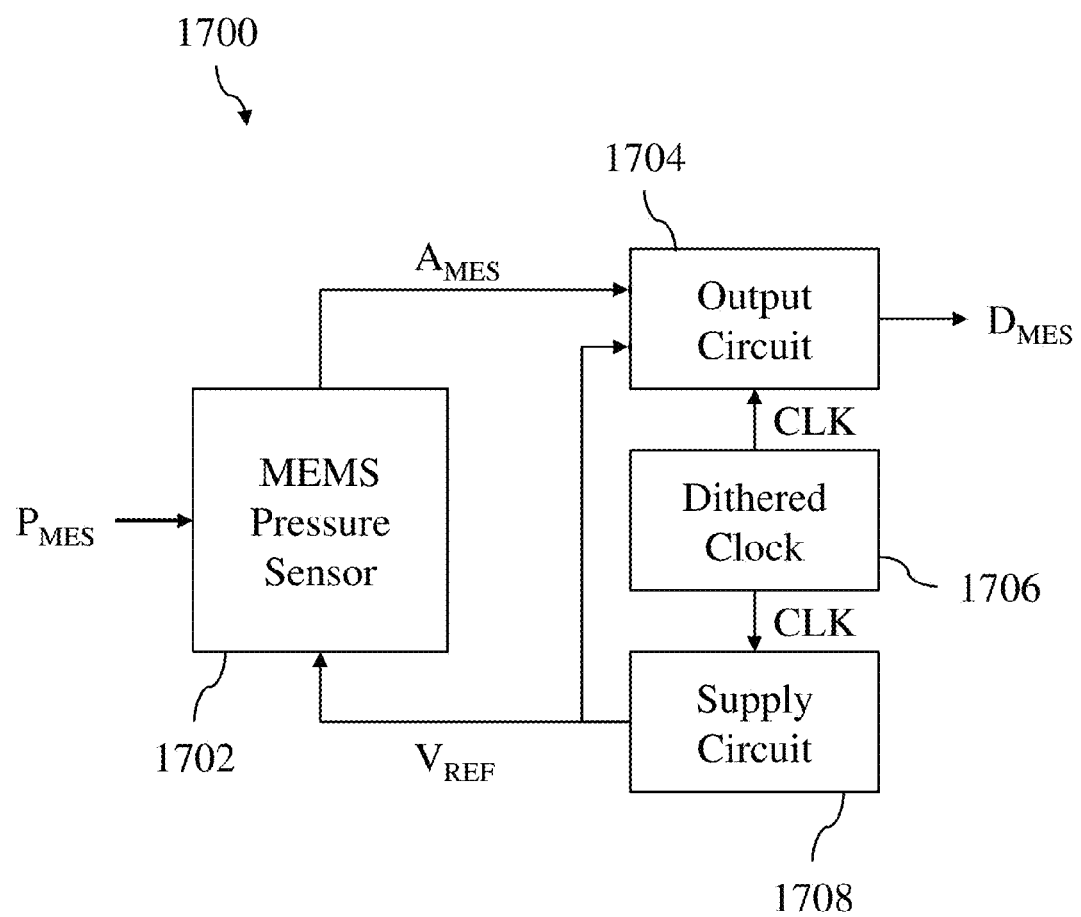
FIG. 17 illustrates a system block diagram of an embodiment MEMS pressure sensor system.

FIG. 17 illustrates a system block diagram of an embodiment MEMS pressure sensor system 1700 including MEMS pressure sensor 1702, output circuit 1704, dithered clock 1706, and supply circuit 1708. According to various embodiments, MEMS pressure sensor 1702 transduces physical pressure measurement $P_{MES}$ into analog signal $A_{MES}$. MEMS pressure sensor 1702 receives a voltage reference $V_{REF}$ from supply circuit 1708, which may generate a switching voltage as voltage reference $V_{REF}$ based on dithered clock signal CLK from dithered clock 1706. Supply circuit 1708 may also provide voltage reference $V_{REF}$ to output circuit 1704. Output circuit 1704 receives analog signal $A_{MES}$ and generates digital pressure signal $D_{MES}$ based on analog signal $A_{MES}$.

In various embodiments, output circuit 1704 operates to amplify, convert, and filter the analog signal $A_{MES}$ in order to generate digital pressure signal $D_{MES}$. In such embodiments, output circuit includes a sigma-delta ADC that converts analog signal $A_{MES}$ into digital pressure signal $D_{MES}$ based on a sampling time controlled by dithered clock signal CLK from dithered clock 1706. The operation of the sigma-delta ADC based on a dithered clock may reduce or remove DC noise components generated through an interaction of idle tones from the sigma-delta ADC and noise in voltage reference $V_{REF}$.

Figure 18:
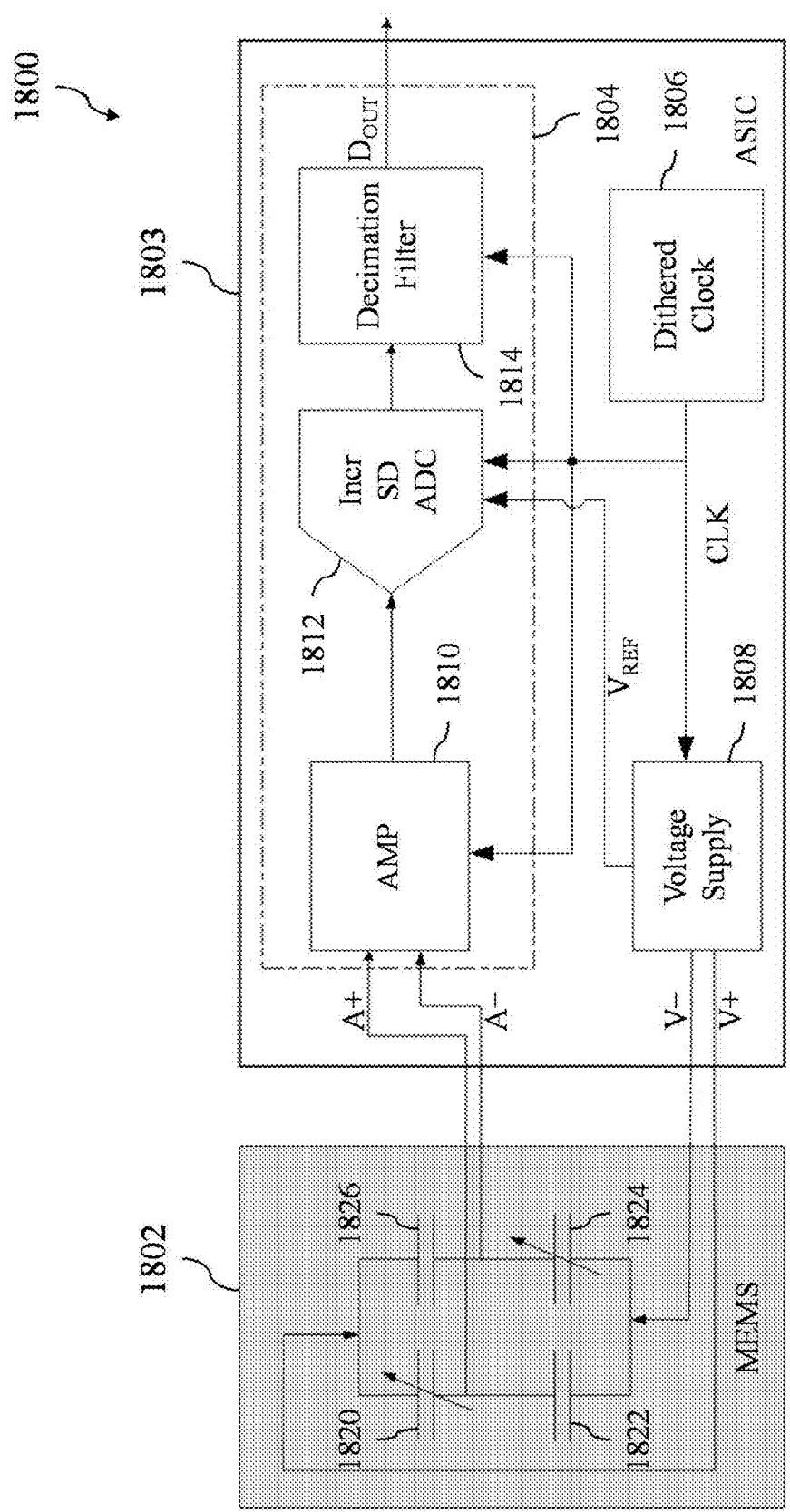
FIG. 18 illustrates a schematic block diagram of a further embodiment MEMS pressure sensor system.

FIG. 18 illustrates a schematic block diagram of a further embodiment MEMS pressure sensor system 1800 including differential output capacitive MEMS pressure transducer 1802 and application specific integrated circuit (ASIC) 1803, which further includes output circuit 1804, dithered clock 1806, and voltage reference supply 1808. Output circuit 1804 includes amplifier 1810, incremental sigma-delta ADC 1812, and decimation filter 1814. MEMS pressure sensor system 1800 may be one implementation of MEMS pressure sensor system 1700 described hereinabove in reference to FIG. 17.

According to various embodiments, differential output capacitive MEMS pressure transducer 1802 transduces physical pressure signals into a differential analog output including analog signals A+ and A−. Differential output capacitive MEMS pressure transducer 1802 includes variable capacitance structure 1820 and variable capacitance structure 1824 connected with reference capacitive structure 1822 and reference capacitive structure 1826 as a capacitive bridge with analog signals A+ and A− output from center nodes of each branch of the capacitive bridge as shown. In such embodiments, reference capacitive structure 1822 and reference capacitive structure 1826 may be formed of electrically conductive structures, i.e., forming parallel plates, separated by a dielectric spacer where the spacing of the electrically conductive structures is fixed and does not vary in response to pressure changes. Variable capacitance structure 1820 and variable capacitance structure 1824 are formed of electrically conductive structures separated by a spacing distance where the spacing of the electrically structures is dependent on the pressure applied to the electrically conductive structures. For example, variable capacitance structure 1820 and variable capacitance structure 1824 may each include a deflectable membrane formed over a sealed cavity above a substrate with an electrically conductive diffusion region below the membrane. In such embodiments, the membrane of the variable capacitance structure may deflect due to a pressure difference between the external surface and the sealed cavity. Such deflections affect the capacitance between the membrane and the electrically conductive diffusion region, which is measured at electrical contacts to the membrane and the electrically conductive diffusion region. Reference capacitive structure 1822 and reference capacitive structure 1826 may each have a similar structure where the cavity is filled with the dielectric spacer material. In other embodiments, many types of capacitive pressure sensors may be used for differential output capacitive MEMS pressure transducer 1802 including capacitive comb drive structures, multiple plate released capacitive plate structures, or other capacitive MEMS structures, for example.

In various embodiments, the differential analog output including analog signals A+ and A− is supplied from differential output capacitive MEMS pressure transducer 1802 to amplifier 1810, which amplifies the differential signal and provides the amplified analog electrical signal proportional to the measured physical pressure to incremental sigma-delta ADC 1812. In other embodiments, incremental sigma-delta ADC 1812 may be any type of sigma-delta ADC. In one particular embodiment, incremental sigma-delta ADC 1812 operates for a set duration or number of samples before ending operation and is thus referred to as incremental. Such an embodiment may reduce power consumption. Incremental sigma-delta ADC 1812 begins operation, e.g., wakeup, on a fixed time delay or in response to a pressure change above a threshold level. In some embodiments, ADC 1812 is powered up for a certain period of time as determined, for example by a target accuracy setting, and then turned off until a next conversion is requested.

In various embodiments, incremental sigma-delta ADC 1812 operates according to dithered clock signal CLK to generate a digital output signal proportional to the input amplified analog electrical signal that is proportional to the measured physical pressure from differential output capacitive MEMS pressure transducer 1802. Incremental sigma-delta ADC 1812 includes a feedback mechanism that continually adjusts the digital output signal. Further description of two example sigma-delta ADCs is provided herein below in reference to FIGS. 21*a* and 21*b*.

In various embodiments, the digital output signal from incremental sigma-delta ADC 1812 may have a high bit rate. Incremental sigma-delta ADC 1812 may include a sampling rate, i.e., an over-sampling rate, that is on the order of 1000 or 10,000 times higher than the intended sampling rate, for example. In one specific embodiment, incremental sigma-delta ADC 1812 may output the digital signal based on a 160 kHz sampling rate, which corresponds to 160,000 samples per second. For such as system, the intended digital output signal may be only 10 Hz. In such embodiments, decimation filter 1814 reduces the 160 kHz signal down to a 10 Hz and outputs digital output signal $D_{OUT}$, which is proportional to the measured physical pressure signal from differential output capacitive MEMS pressure transducer 1802, at the 10 Hz frequency. Thus, decimation filter 1814 reduces the bit rate by a factor of 16,000. In other embodiments, decimation filter 1814 may reduce the bit rate by other factors.

According to various embodiments, dithered clock 1806 supplies dithered clock signal CLK to incremental sigma-delta ADC 1812 for controlling the sampling rate of the sigma-delta ADC. In various embodiments, dithered clock signal CLK may also be provided to voltage reference supply 1808, amplifier 1810, or decimation filter 1814. Dithered clock 1806 generates dithered clock signal CLK with jitter or random periods. Generally, a clock signal is generated with a fixed or constant period, including, for example, constant rising or logic high durations and constant falling or logic low durations. In the case of dithered clock 1806, the rising or logic high durations and falling or logic low durations are adjusted. In such embodiments, the adjustments of the dithered clock signal CLK may be random or pseudo-random. Thus, dithered clock signal CLK is generated to intentionally include substantial clock jitter with varied rising or logic high durations or varied falling or logic low durations.

In various embodiments, voltage reference supply 1808 supplies voltage reference $V_{REF}$ to incremental sigma-delta ADC 1812 in order to supply power to the ADC. Voltage reference supply 1808 may also provide reference voltages to differential output capacitive MEMS pressure transducer 1802 in order to bias the capacitive structures. Specifically, voltage reference supply 1808 provides positive reference voltage V+ and negative reference voltage V−. In some particular embodiments, voltage reference supply 1808 provides pulsed reference voltages to differential output capacitive MEMS pressure transducer 1802. In such embodiments, voltage reference supply 1808 may include a chopper switch to switch the reference voltages supplied to differential output capacitive MEMS pressure transducer 1802.

In various embodiments, differential output capacitive MEMS pressure transducer 1802 and ASIC 1803 are formed on separate wafers or dies. In other embodiments, differential output capacitive MEMS pressure transducer 1802 and ASIC 1803 are formed on a same wafer or die, such as a single integrated circuit (IC) die.

Figure 19A:
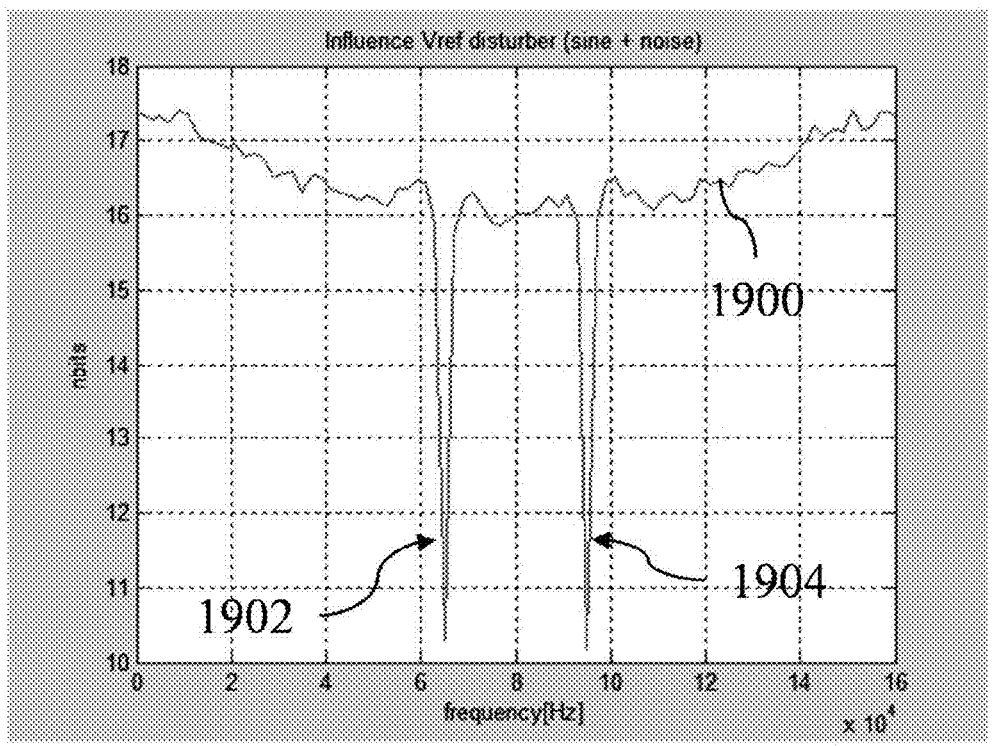
FIGS. 19a and 19b illustrate waveform diagrams of example noise signals generated in a sigma-delta analog to digital converter (ADC)
Figure 19B:
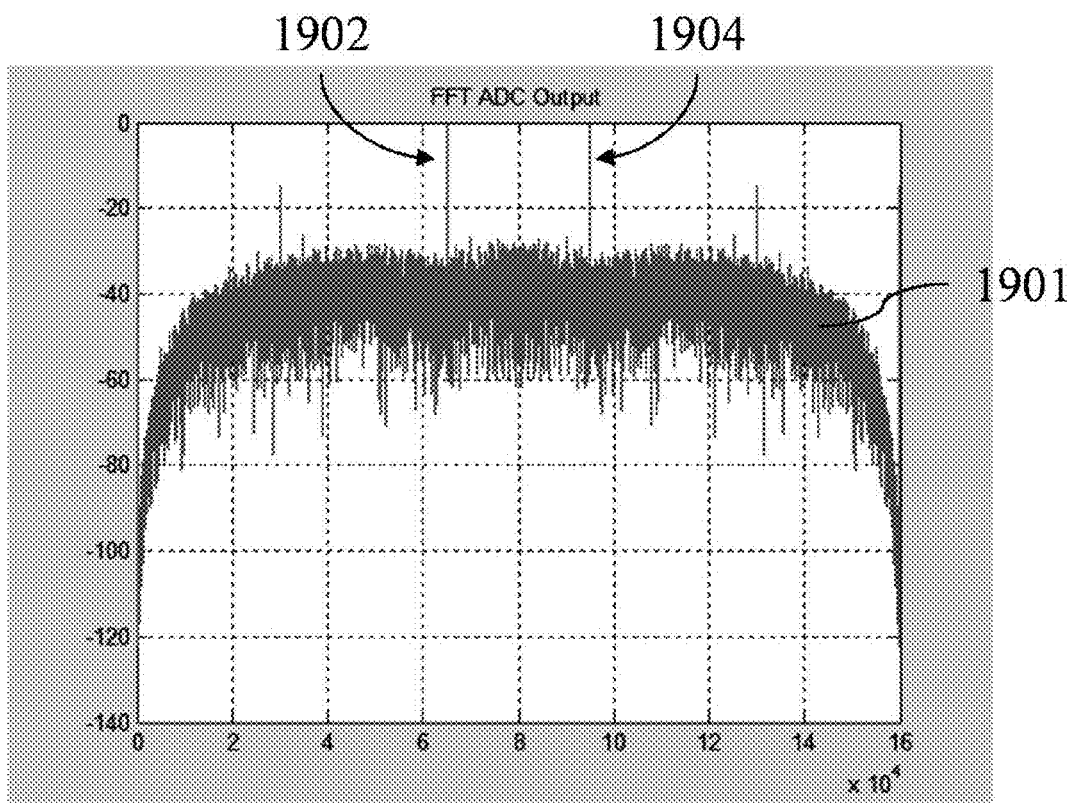

FIGS. 19*a* and 19*b* illustrate waveform diagrams of example noise signals generated in a sigma-delta ADC. FIG. 19*a* shows plot 1901 depicting a fast Fourier transform (FFT) of the output of the sigma-delta ADC, which also shows idle tone 1912 and idle tone 1914 at about 65 kHz and 95 kHz, respectively. Idle tones are unwanted bit sequences at specific frequencies, as shown, in the output that are not based on the input signal to the sigma-delta ADC. These idle tones are an artifact of the feedback mechanism in the sigma-delta ADC, and may be present when the input signal to the ADC is not "busy." In some cases, the idle tones may be especially strong when the ADC uses a one-bit (2-level) quantizer. Such a situation is applicable to embodiment pressure sensors that use a sigma-delta ADC with a one-bit quantizer for good linearity.

FIG. 19*b* shows plot 1900 depicting the number of bits, which indicates the approximate accuracy, of the sigma-delta ADC. Plot 1900 was generated by introducing an unwanted sinewave at the sigma-delta ADC's reference voltage in order to determine the robustness of the sigma-delta ADC with respect to supply voltage ripple. The frequency of this sinewave signal is swept from 0 to 160 kHz and the integrated noise was measured. Accordingly, the ADC is most sensitive to disturbers at Vref which have the same frequency as the idle tones. Since idle tone frequency varies with the DC-input level of the sigma-delta ADC, which in some embodiments may be measured pressure from a MEMS sensor, the sensitivity to disturbers changes with the ADC input. Such a behavior is problematic in some embodiments because it is difficult to predict if the idle tone behavior leads to a problem in a particular application. In this example sigma-delta ADC, there is a sharp decrease in accuracy at about 65 kHz and 95 kHz at points 1902 and 1904, respectively that correspond to the frequency of idle tones 1912 and 1914 shown in FIG. 19*a*.

As described briefly hereinabove, the inventors have determined that idle tones present in a sigma-delta ADC interact with noise in the reference voltage supply in a multiplicative manner to produce an error component at DC. Thus, idle tone 1902 and idle tone 1904 may interact with noise in the reference voltage supplied to the sigma-delta ADC. As described hereinabove in reference to FIGS. 17 and 18, various embodiments include providing dithered clock signal CLK to the sigma-delta ADC. In such embodiments, the sharp value of the idle tones, such as idle tone 1902 and idle tone 1904, is dispersed across frequency spectrum and the noise component at DC produced from the idle tone in combination with the noise in the reference voltage supply is reduced or removed. An embodiment noise plot is shown in FIG. 20.

Figure 20:
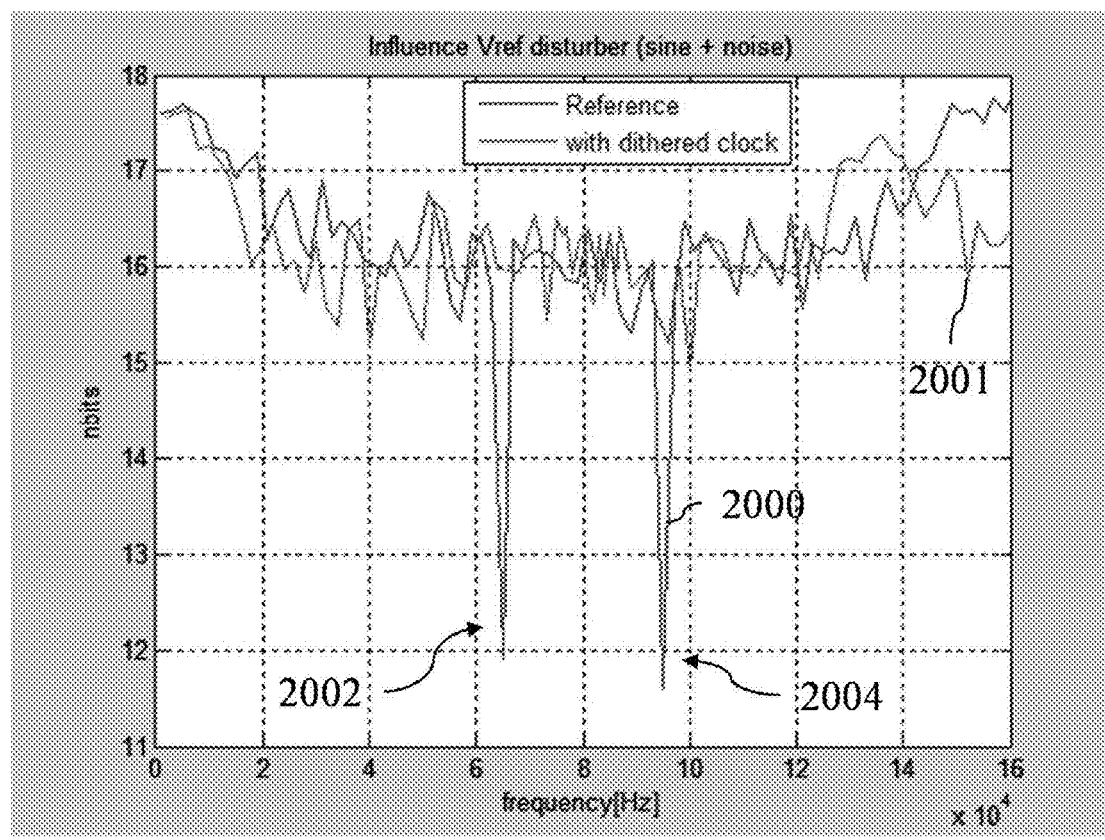
FIG. 20 illustrates a waveform diagram of noise signals generated in a sigma-delta analog to digital converter (ADC) without a dithered clock and with a dithered clock.

FIG. 20 illustrates a waveform diagram of noise signals generated in a sigma-delta ADC without a dithered clock (plot 2000) and with a dithered clock (plot 2001) showing a comparison of resolution with respect to reference voltage disturber frequency. As shown, the example sigma-delta ADC with a standard non-dithered clock (plot 2000) indicates a loss in performance at points 2002 and 2004 corresponding to idle tones 1912 and 1914 shown in FIG. 19*a* above. However, the embodiment sigma-delta ADC with a dithered clock does not substantially loose noise performance at idle tone frequencies. As shown in plot 2001, there is a substantially reduced loss of noise performance at the 65 kHz and 95 kHz idle tone frequencies. In such embodiments, the clock dithering may spread the frequency spectrum of idle tones and reduce or remove the DC noise component produced by the multiplicative interaction of the idle tones and the noise in the reference voltage supply.

Figure 21A:
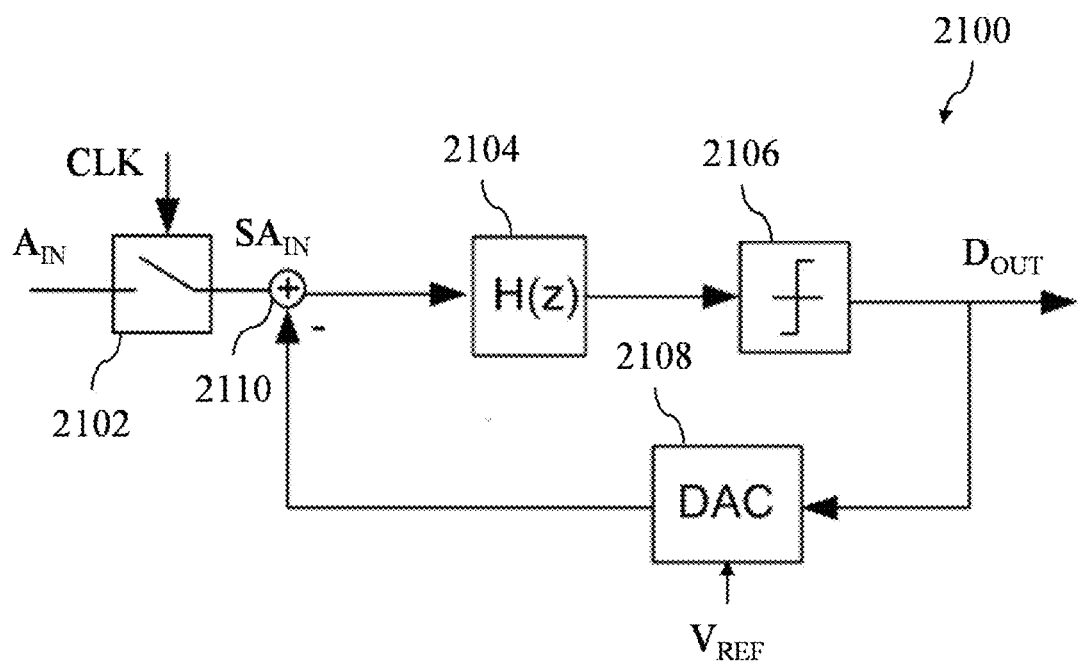
FIGS. 21a and 21b illustrate schematic block diagrams of embodiment sigma-delta analog to digital converters (ADCs)
Figure 21B:
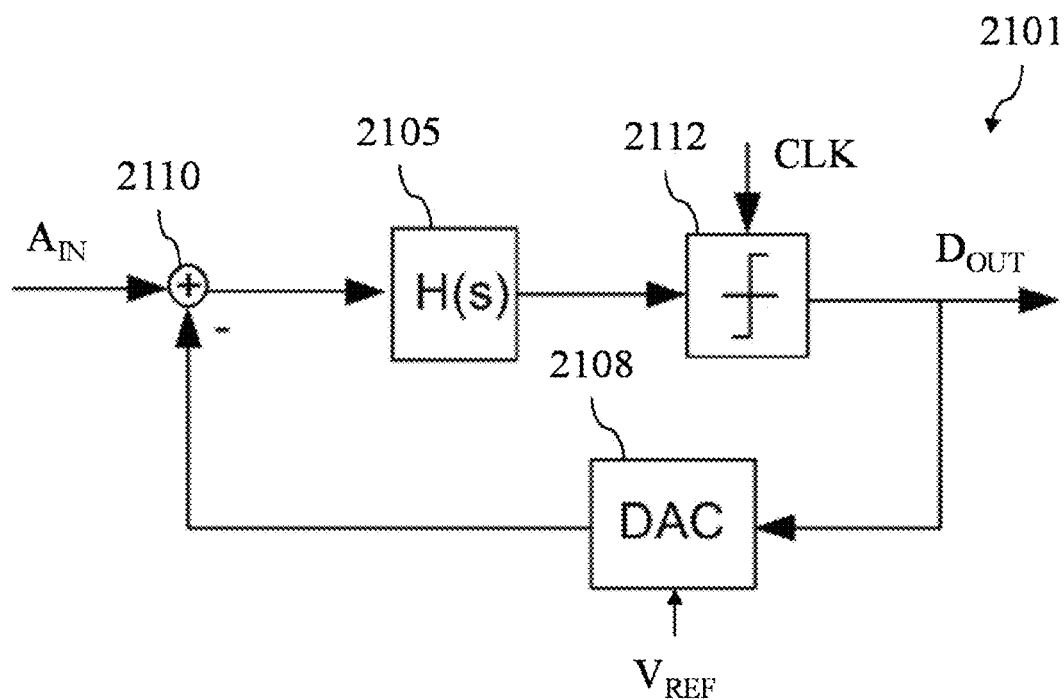

FIGS. 21a and 21b illustrate schematic block diagrams of embodiment sigma-delta ADCs 2100 and 2101. FIG. 21a shows discrete time sigma-delta ADC 2100 including sampling switch 2102, loop filter 2104, comparator 2106, digital to analog converter (DAC) 2108, and adder 2110. According to various embodiments, discrete time sigma-delta ADC 2100 receives analog input signal $A_{IN}$ at sampling switch 2102. Analog input signal $A_{IN}$ may be an amplified analog signal received from an amplifier that is coupled to a capacitive MEMS pressure transducer, such as from amplifier 1810 described hereinabove in reference to FIG. 18. Thus, analog input signal $A_{IN}$ may be proportional to a measured physical pressure signal, for example.

In various embodiments, sampling switch 2102 is controlled by dithered clock signal CLK, which may be provided from dithered clocks 1706 or 1806 as described hereinabove in reference to FIGS. 17 and 18. Dithered clock signal CLK causes sampling switch 2102 to open and close according to the sampling rate equal to the frequency of dithered clock signal CLK. Thus, sampling switch 2102 generates sampled analog input signal $SA_{IN}$, which is provided through adder 2110 to loop filter 2104. By virtue of sampling, the analog signal is no longer a continuous signal, but is instead a discretely sampled analog input signal $SA_{IN}$. In such embodiments, loop filter 2104 may be implemented as a low pass filter (LPF) in order to remove higher frequency components. In some embodiments, loop filter 2104 is implemented as an integrator.

According to various embodiments, after filtering in loop filter 2104, the sampled and filtered analog input signal is provided to comparator 2106, which compares the input signal to a threshold value. For example, the threshold value may be 0 V. Based on the comparison, comparator 2106 provides digital output signal $D_{OUT}$. The stream of bits in digital output signal $D_{OUT}$ is proportional to analog input signal $A_{IN}$. Further, digital output signal $D_{OUT}$ is provided through DAC 2108 back to adder 2110. In such embodiments, DAC 2108 is supplied by voltage reference $V_{REF}$ such as from supply circuit 1708 or voltage reference supply 1808 described hereinabove in reference to FIGS. 17 and 18.

As discussed herein, the feedback loop of some sigma-delta ADCs may generate idle tones and there may be noise in voltage reference $V_{REF}$. In such ADCs, these two error sources may be multiplicatively combined by a DAC to form a DC error component. In various embodiments, the introduction of dithered clock signal CLK from a dithered clock spreads the frequency of the idle tones and reduces or removes the DC error component. Adder 2110 combines the reconverted analog output of DAC 2108 with sampled analog input $SA_{IN}$ in order to provide feedback for improved performance.

FIG. 21b shows continuous time sigma-delta ADC 2101 including loop filter 2105, clocked comparator 2112, DAC 2108, and adder 2110. According to various embodiments, continuous time sigma-delta ADC 2101 operates as described hereinabove in reference to discrete time sigma-delta ADC 2100 in FIG. 21a, where sampling switch 2102 is removed, loop filter 2104 is replaced with loop filter 2105, and comparator 2106 is replaced with clocked comparator 2112. In such embodiments, analog input signal $A_{IN}$ is provided through adder 2110 to loop filter 2105. Loop filter 2105 may operate as described in reference to loop filter 2104, but is arranged to receive a continuous time signal in analog input signal $A_{IN}$ instead of a discretely sampled signal in sampled analog input signal $SA_{IN}$.

In various embodiments, clocked comparator 2112 compares the filtered analog input signal to a threshold voltage and provides the result of the conversion with the dithered clock signal CLK to generate digital output signal $D_{OUT}$. In some embodiments, the threshold voltage may be zero volts, VDD/2 and/or other threshold voltages. In such embodiments, dithered clock signal CLK determines the sampling rate of continuous time sigma-delta ADC 2101. As described hereinabove in reference to FIG. 21a, DAC 2108 provides feedback through adder 2110.

In such embodiments, providing dithered clock signal CLK to clocked comparator 2112 provides the same benefits as described hereinabove in reference to dithered clock signal CLK in the other Figures.

Figure 22:
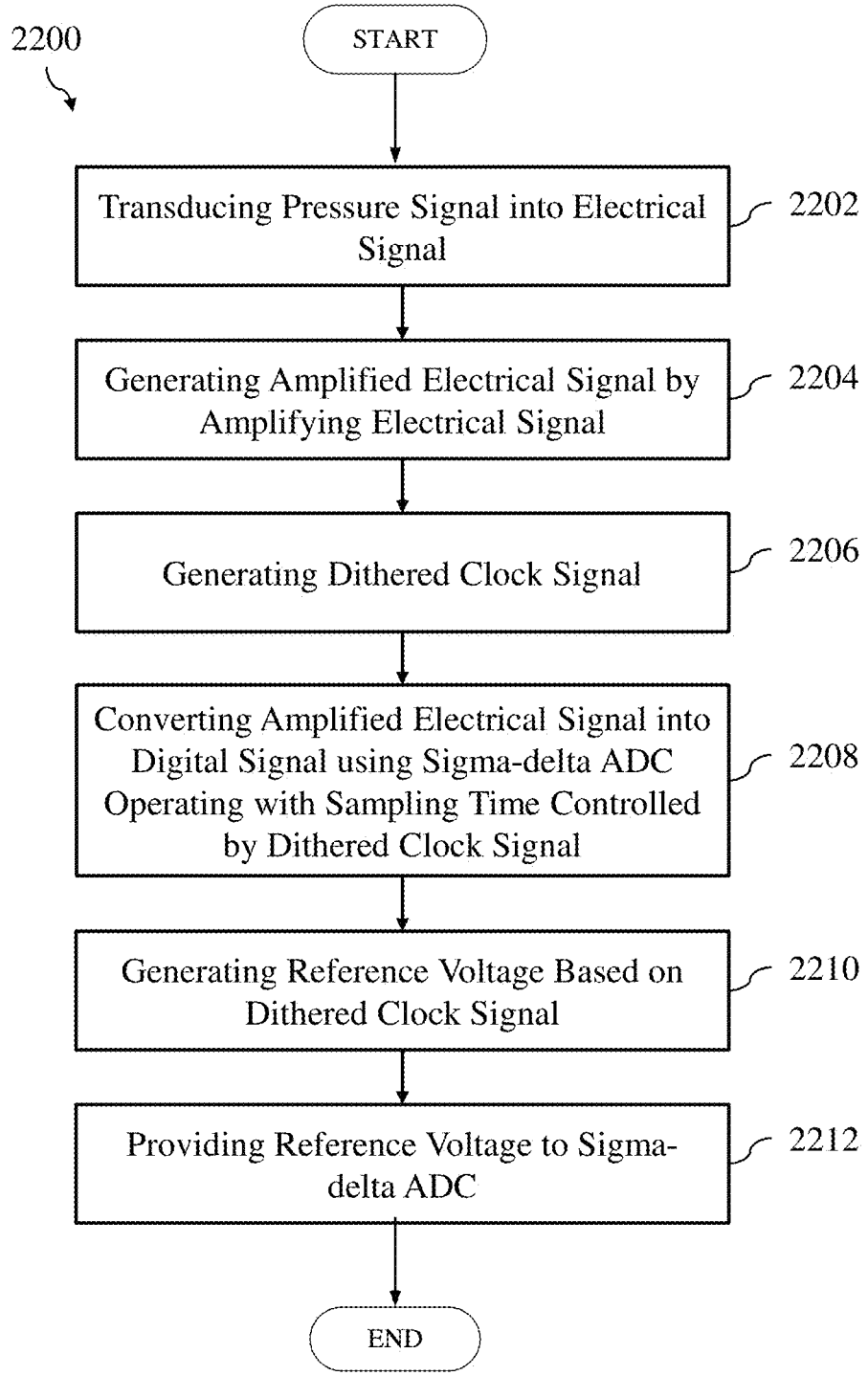
FIG. 22 illustrates a block diagram of an embodiment method of operation for a sensor.

FIG. 22 illustrates a block diagram of an embodiment method of operation 2200 for a sensor. Method of operation 2200 includes steps 2202-2212. According to various embodiments, step 2202 includes transducing a pressure signal into an electrical signal. The pressure signal may be measured and transduced using a capacitive MEMS pressure transducer. Step 2204 includes generating an amplified electrical signal by amplifying the electrical signal. For example, the electrical signal may be amplified by a differential input amplifier. Step 2206 includes generating a dithered clock signal. In such embodiments, a dithered clock is included in the sensor system to generate the dithered clock signal. In step 2207, a reference voltage is provided to the sigma-delta ADC.

According to various embodiments, step 2208 includes converting the amplified electrical signal into a digital signal using a sigma-delta ADC operating with a sampling time controlled by the dithered clock signal generated in step 2206. In various embodiments, steps 2202-2208 may be rearranged and performed in other orders and method of operation 2200 may be modified to include additional steps.

In accordance with various embodiments, circuits or systems may be configured to perform particular operations or actions by virtue of having hardware, software, firmware, or a combination of them installed on the system that in operation causes or cause the system to perform the actions. According to an embodiment, a sensor circuit includes a sigma-delta analog to digital converter (ADC) configured to be coupled to a low frequency transducer, a dithered clock coupled to the sigma-delta ADC and configured to control of the sigma-delta ADC based on a dithered clock signal, and a supply voltage circuit coupled to the sigma-delta ADC. Other embodiments include corresponding systems and apparatus, each configured to perform various embodiment methods.

In various embodiments, the sensor circuit further includes the low frequency transducer, where the low frequency transducer includes a microelectromechanical systems (MEMS) pressure transducer. In some embodiments, the MEMS pressure transducer includes a differential capacitive MEMS pressure transducer. In further embodiments, the sensor circuit further includes an amplifier having an input coupled to the MEMS pressure transducer and an output coupled to the sigma-delta ADC. In such embodiments, the amplifier may include a differential input amplifier having a first input coupled to a first capacitive structure of the MEMS pressure transducer and a second input coupled to a second capacitive structure of the MEMS pressure transducer.

In various embodiments, the supply voltage circuit is further coupled to the dithered clock and is configured to operate based on the dithered clock signal. In some embodiments, the supply voltage circuit includes a clocked charge pump circuit configured to operate based on the dithered clock signal.

In various embodiments, the sensor circuit further includes a filter coupled to the sigma-delta ADC. The filter may include a decimation filter. In some embodiments, the sigma-delta ADC includes a sampled sigma-delta ADC including a sampling switch having a sampling time based on the dithered clock signal, a loop filter coupled to the sampling switch, a comparator coupled to the loop filter, and a negative feedback loop coupled to the comparator and an input of the loop filter. In further embodiments, the sigma-delta ADC includes a continuous time sigma-delta ADC including a loop filter, a clocked comparator coupled to the loop filter and configured to operate based on the dithered clock signal, and a negative feedback loop coupled to the clocked comparator and an input of the loop filter.

According to an embodiment, a method of operating a sensor includes receiving an electrical signal from a low frequency transducer, generating a dithered clock signal, and converting the electrical signal into a digital signal using a sigma-delta analog to digital converter (ADC) operating based on the dithered clock signal. Other embodiments include corresponding systems and apparatus, each configured to perform various embodiment methods.

In various embodiments, the method further includes transducing a pressure signal into the electrical signal at a MEMS pressure transducer. The method may further include amplifying the electrical signal before converting the electrical signal into the digital signal. In some embodiments, the method further includes generating a reference voltage, and providing the reference voltage to the sigma-delta ADC. In such embodiments, generating the reference voltage may include clocking a charge pump circuit using the dithered clock signal.

In various embodiments, the method further includes filtering the digital signal using a decimation filter. In some embodiments, converting the electrical signal into the digital signal using the sigma-delta ADC operating based on the dithered clock signal includes generating a sampled signal by sampling the electrical signal with a sampling time that is based on the dithered clock signal, generating a filtered signal by filtering the sampled signal at a loop filter, generating the digital signal by comparing the filtered signal to a threshold, and generating a feedback signal for the loop filter based on the digital signal.

In various embodiments, converting the electrical signal into the digital signal using the sigma-delta ADC operating based on the dithered clock signal includes generating a filtered signal by filtering the electrical signal at a loop filter, generating the digital signal by comparing the filtered signal to a threshold based on the dithered clock signal, and generating a feedback signal for the loop filter based on the digital signal.

According to an embodiment, a microelectromechanical systems (MEMS) capacitive pressure sensor system includes a differential output MEMS capacitive pressure sensor including a first reference capacitive structure, a first variable capacitance structure configured to vary a first capacitance value in reference to a first pressure signal, a first output coupled between the first reference capacitive structure and the first variable capacitance structure, a second reference capacitive structure, a second variable capacitance structure configured to vary a second capacitance value in reference to a second pressure signal, and a second output coupled between the second reference capacitive structure and the second variable capacitance structure. The MEMS capacitive pressure sensor system also includes a differential amplifier coupled to the first output and the second output of the differential output MEMS capacitive pressure sensor, a sigma-delta analog to digital converter (ADC) coupled to an output of the differential amplifier, and a dithered clock coupled to the sigma-delta ADC and configured to control a sampling time of the sigma-delta ADC using a dithered clock signal. Other embodiments include corresponding systems and apparatus, each configured to perform various embodiment methods.

In various embodiments, the MEMS capacitive pressure sensor system further includes a supply voltage circuit coupled to the sigma-delta ADC. In some embodiments, the supply voltage circuit includes a charge pump circuit coupled to the dithered clock and configured to be clocked with the dithered clock signal. In further embodiments, the sigma-delta ADC includes an incremental sigma-delta ADC. In additional embodiments, the first pressure signal and the second pressure signal are a same pressure signal.

In some specific embodiments, a MEMS pressure transducer with a sigma-delta ADC operated according to a dithered clock signal generated by a dithered clock is particularly advantageous. In such specific embodiments, the absolute pressure measurement or very low frequency pressure measurement is particularly affected by DC noise from idle tones and reference voltage supply noise as described hereinabove. Thus, such specific embodiments include particular advantages of decreased noise or reduced error components at DC and very low frequency measurements, which may allow improved sensitivity or greater resolution.

A further advantage of some embodiments includes having a more robust sensor that is less susceptible to disturbers at sensor supply nodes, especially tonal disturbers having a same or similar frequency as ADC idle tones.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A sensor circuit comprising:
   a sigma-delta analog to digital converter (ADC) configured to be coupled to a microelectromechanical systems (MEMS) pressure transducer;
   a dithered clock generator coupled to the sigma-delta ADC, the dithered clock generator configured to produce a dithered clock signal and configured to control the sigma-delta ADC based on the dithered clock signal; and
   a supply voltage circuit having an input coupled to the dithered clock generator and a first output configured to be coupled to a capacitive structure of the MEMS pressure transducer, and a second output coupled to a reference voltage input of the sigma-delta ADC, the supply voltage circuit configured to apply a pulsed reference voltage to the capacitive structure of the MEMS pressure transducer according to the dithered clock signal.

2. The sensor circuit of claim 1, further comprising the MEMS pressure transducer.

3. The sensor circuit of claim 2, wherein the MEMS pressure transducer comprises a differential capacitive MEMS pressure transducer.

4. The sensor circuit of claim 2, further comprising an amplifier having an input coupled to the MEMS pressure transducer and an output coupled to the sigma-delta ADC.

5. The sensor circuit of claim 4, wherein the capacitive structure of the MEMS pressure transducer comprises a first capacitive structure and a second capacitive structure, and the amplifier comprises a differential input amplifier having a first input coupled to the first capacitive structure of the MEMS pressure transducer and a second input coupled to the second capacitive structure of the MEMS pressure transducer.

6. The sensor circuit of claim 1, wherein the supply voltage circuit comprises a clocked charge pump circuit configured to operate based on the dithered clock signal.

7. The sensor circuit of claim 1, further comprising a filter coupled to the sigma-delta ADC.

8. The sensor circuit of claim 7, wherein the filter comprises a decimation filter.

9. The sensor circuit of claim 1, wherein the sigma-delta ADC comprises a sampled sigma-delta ADC comprising:
a sampling switch having a sampling time based on the dithered clock signal;
a loop filter coupled to the sampling switch;
a comparator coupled to the loop filter; and
a negative feedback loop coupled to the comparator and an input of the loop filter.

10. The sensor circuit of claim 1, wherein the sigma-delta ADC comprises a continuous time sigma-delta ADC comprising:
a loop filter;
a clocked comparator coupled to the loop filter and configured to operate based on the dithered clock signal; and
a negative feedback loop coupled to the clocked comparator and an input of the loop filter.

11. A method of operating a sensor, the method comprising:
receiving an electrical signal from a microelectromechanical systems (MEMS) pressure transducer;
generating a dithered clock signal;
generating a pulsed reference voltage according to the dithered clock signal;
applying the pulsed reference voltage to a capacitive structure of the MEMS pressure transducer; and
converting the electrical signal into a digital signal using a sigma-delta analog to digital converter (ADC) operating based on the dithered clock signal.

12. The method of claim 11, further comprising transducing a pressure signal into the electrical signal at the MEMS pressure transducer.

13. The method of claim 12, further comprising amplifying the electrical signal before converting the electrical signal into the digital signal.

14. The method of claim 11, further comprising:
generating a reference voltage; and
providing the reference voltage to the sigma-delta ADC.

15. The method of claim 14, wherein generating the reference voltage comprises clocking a charge pump circuit using the dithered clock signal.

16. The method of claim 11, further comprising filtering the digital signal using a decimation filter.

17. The method of claim 11, wherein converting the electrical signal into the digital signal using the sigma-delta ADC operating based on the dithered clock signal comprises:
generating a sampled signal by sampling the electrical signal with a sampling time that is based on the dithered clock signal;
generating a filtered signal by filtering the sampled signal at a loop filter;
generating the digital signal by comparing the filtered signal to a threshold; and
generating a feedback signal for the loop filter based on the digital signal.

18. The method of claim 11, wherein converting the electrical signal into the digital signal using the sigma-delta ADC operating based on the dithered clock signal comprises:
generating a filtered signal by filtering the electrical signal at a loop filter;
generating the digital signal by comparing the filtered signal to a threshold based on the dithered clock signal; and
generating a feedback signal for the loop filter based on the digital signal.

19. A microelectromechanical systems (MEMS) capacitive pressure sensor system comprising:
a differential output MEMS capacitive pressure sensor comprising:
a first reference capacitive structure,
a first variable capacitance structure configured to vary a first capacitance value in reference to a first pressure signal,
a first output coupled between the first reference capacitive structure and the first variable capacitance structure,
a second reference capacitive structure,
a second variable capacitance structure configured to vary a second capacitance value in reference to a second pressure signal, and
a second output coupled between the second reference capacitive structure and the second variable capacitance structure;
a differential amplifier coupled to the first output and the second output of the differential output MEMS capacitive pressure sensor;
a sigma-delta analog to digital converter (ADC) coupled to an output of the differential amplifier;
a dithered clock generator coupled to the sigma-delta ADC, the dithered clock generator configured to generate a dithered clock signal, and configured to control a sampling time of the sigma-delta ADC using the dithered clock signal; and
a supply voltage circuit having an input coupled to the dithered clock generator and a first output coupled to the first variable capacitance structure and the second variable capacitance structure, the supply voltage circuit configured to generate a pulsed reference voltage at the first output based on the dithered clock signal.

20. The MEMS capacitive pressure sensor system of claim 19, wherein the supply voltage circuit further comprises a second output coupled to the sigma-delta ADC.

21. The MEMS capacitive pressure sensor system of claim 20, wherein the supply voltage circuit comprises a charge pump circuit coupled to the dithered clock generator and configured to be clocked with the dithered clock signal.

22. The MEMS capacitive pressure sensor system of claim 21, wherein the sigma-delta ADC comprises an incremental sigma-delta ADC.

23. The MEMS capacitive pressure sensor system of claim 19, wherein the first pressure signal and the second pressure signal are a same pressure signal.

24. The MEMS capacitive pressure sensor system of claim 19, wherein the dithered clock generator configured to vary a period of the dithered clock signal by $\Delta T_{per}$, where $\Delta T_{per}$, is less than one quarter of the period of the dithered clock signal.

25. The sensor circuit of claim 1, wherein the dithered clock generator is configured to vary a period of the dithered clock signal by $\Delta T_{per}$, where $\Delta T_{per}$, is less than one quarter of the period of the dithered clock signal.

26. The method of claim 11, wherein generating the dithered clock signal comprises varying a period of the dithered clock signal by $\Delta T_{per}$, where $\Delta T_{per}$, is less than one quarter of the period of the dithered clock signal.

* * * * *